United States Patent
Kobayashi et al.

(10) Patent No.: US 6,243,292 B1
(45) Date of Patent: Jun. 5, 2001

(54) NONVOLATILE SEMICONDUCTOR MEMORY DEVICE CAPABLE OF REDUCING MEMORY ARRAY AREA

(75) Inventors: Shinichi Kobayashi; Yoshikazu Miyawaki; Shinji Kawai; Tomoshi Futatsuya, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/613,691

(22) Filed: Jul. 10, 2000

(30) Foreign Application Priority Data

Jan. 27, 2000 (JP) .................................................. 12-018547

(51) Int. Cl.$^7$ ...................................................... G11C 7/00
(52) U.S. Cl. ................. 365/185.13; 365/185.29; 365/185.27
(58) Field of Search .................. 365/185.13, 185.11, 365/185.29, 185.27

(56) References Cited

U.S. PATENT DOCUMENTS

| 5,392,238 | * | 2/1995 | Kirisawa | 365/63 |
| 5,994,732 | | 11/1999 | Ajika et al. | |
| 6,038,170 | * | 3/2000 | Shiba | 365/185.13 |

FOREIGN PATENT DOCUMENTS

| 9-307005 | 11/1997 | (JP) . |
| 11-3595 | 1/1999 | (JP) . |

* cited by examiner

*Primary Examiner*—A. Zarabian
(74) *Attorney, Agent, or Firm*—McDermott, Will & Emery

(57) ABSTRACT

A memory cell array is divided into a plurality of memory cell blocks each collectively subjected to an erasing operation as a unit. A P well regions for memory cell transistors and an N well region for electrically separating the P well regions are provided. Select transistors are formed in the same P well region as the memory cell transistor connected to the corresponding sub bit line of P well regions.

8 Claims, 19 Drawing Sheets

NONVOLATILE SEMICONDUCTOR MEMORY DEVICE CAPABLE OF REDUCING MEMORY ARRAY AREA

BACKGROUND OF THE INVENTION

1. Field of the Invention

The present invention relates to a structure of a nonvolatile semiconductor memory device capable of electrically writing and erasing data and retaining its data when power is removed.

2. Description of the Background Art

Nonvolatile semiconductor devices are mounted in systems as memory devices capable of retaining data in a nonvolatile manner at portable terminals to comply with the recent development in digital communication networks using portable information terminals such as portable telephones, internets and the like. Among such nonvolatile semiconductor memory devices, for example, there is a flash memory which is capable of collectively and electrically erasing stored data by a prescribed number of bits and electrically writing data.

FIG. 16 is a schematic diagram showing a cross sectional structure of a memory cell transistor of a so-called NOR flash memory, among such flash memories, in conjunction with the first erasing operation.

Referring to FIG. 16, a memory cell of the flash memory is provided with a multilayer gate disposed on a P well 10 formed in a main surface of the semiconductor substrate. The multilayer gate is provided with a gate oxide film 13, a floating gate 14 of polycrystalline silicon or the like, an insulating film 15 generally called an ONO film having three layers of an oxide film, nitride film, and oxide film for preventing leakage, and a control gate 16 formed of polycrystalline silicon or the like. In vicinity of the multilayer gate on P well 10, an N type source region 12a and drain region 12b are formed in a self-aligning manner.

In the following description, assume that a source voltage Vs, a drain voltage Vd, a control voltage Vcg, and a well potential Vw are respectively applied to the source region, drain region, control gate and P well 10.

In the erasing operation of the memory cell of the flash memory shown in FIG. 16, a high voltage Vpp (up to 10V) obtained by boosting an external power supply voltage is applied as source voltage Vs to a source of the memory cell. The drain is brought into a floating state. A ground potential is used as potential Vw of P well 10. Thus, electrons accumulated in floating gate 14 can be extracted and swept into the side of the source.

FIG. 17 is a diagram showing a cross sectional structure of a memory cell array in which such NOR type flash memories are arranged.

In the structure shown in FIG. 17, bit lines are hierarchically divided into a main bit line MBL and sub bit lines SBL1 and SBL2 respectively connected to main bit line MBL via select transistors Trs1 and Trs2, in order to make a data writing unit as small as possible. More specifically, data is only written to the memory cell block connected to sub bit line SBL1 (or SBL2) selected by select transistor Trs.

As in FIG. 16, if the erasing operation is performed by extracting electrons from the source, a back gate of the memory cell transistor, or P well 10, can be shared by blocks to be erased and select transistors.

On the other hand, in an erasing method of an NOR type flash memory, a high voltage is applied to the back gate of the memory cell, or P well 10, so that electrons in floating gate 14 is extracted and swept into the side of P well 10 and a threshold voltage Vth of the memory cell transistor is decreased.

FIG. 18 is a schematic diagram shown in conjunction with a second erasing method of such an NOR type flash memory.

As shown in FIG. 18, in the second erasing method, source potential Vs and drain potential Vd of the memory cell transistor are both equal to a boosted potential Vpp, and a potential of the P well is also equal to boosted potential Vpp.

A potential of the control gate is for example equal to a ground potential.

FIG. 19 is a cross sectional view shown in conjunction with a structure of a memory cell array when data is erased by extracting electrons from such a P well 10 (a back gate).

In the method shown in conjunction with FIG. 18, as the erasing operation is performed by extracting electrons toward the side of P well 10, P wells 10.1 and 10.2 must be separated by an N well 8 for every data writing unit (a memory block). In addition, also for select transistors Trs1 and Trs2 which select memory blocks for a writing operation, a P well 10.0 including select transistors Trs1 and Trs2 must be separated from P wells 10.1 and 10.2 of the writing units, i.e., memory blocks.

As described above, although the second erasing method has an advantage over the first erasing method in terms of reliability and the like, the wells for the memory blocks as writing units and the well for select gates Trs1 and Tr2 must be separated. Thus, a region required for separation of wells increases, whereby a memory cell area as a whole disadvantageously increases.

SUMMARY OF THE INVENTION

An object of the present invention is to provide a nonvolatile semiconductor memory device capable of preventing an increase in area of a memory cell array while maintaining reliability of the memory cell transistor.

In short, the present invention is a nonvolatile semiconductor memory device formed in a main surface of a semiconductor substrate including an internal power supply circuit, a memory cell array, a plurality of first well regions of a first conductivity type, a second well region of a second conductivity type, a plurality of main bit lines, a plurality of sub bit lines, a plurality of select transistors, and a cell select circuit.

The internal power supply circuit receives an external power supply potential for generating an internal potential.

The memory cell array includes a plurality of memory cell transistors arranged in a matrix each capable of storing data in a nonvolatile manner and electrically writing and reading data. The memory cell array is divided into a plurality of memory cell blocks each serving as a unit collectively subjected to an erasing operation.

The plurality of first well regions of the first conductivity type are provided in the main surface of the semiconductor substrate corresponding to memory cell blocks, and provided with memory cell transistors belonging to respective memory cell blocks. The second well region of the second conductivity type electrically separates the plurality of first well regions.

The plurality of main bit lines are shared by the plurality of memory cell blocks corresponding to columns of the memory cell array. The plurality of sub bit lines are provided corresponding to columns of memory cell transistors for every memory cell block and connected to respective memory cell transistors.

The plurality of select transistors are provided corresponding to sub bit lines and each selectively connecting corresponding sub bit line and corresponding one of the plurality of main bit lines. The cell select circuit applies a potential related to a conductive state to a gate of a selected select transistor and applies a potential related to a cut-off state to a gate of a non-selected select transistor of a plurality of select transistors.

Each of the select transistors is provided in one of the plurality of first well regions that also includes the memory cell transistor to which the corresponding sub bit line is connected.

Therefore, a main advantage of the present invention is that a considerable reduction in area of the memory cell array as well as in chip size can be achieved as the memory cell transistor and the select transistor are formed in the same well.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Structure of Nonvolatile Semiconductor Memory Device

Figure 1:
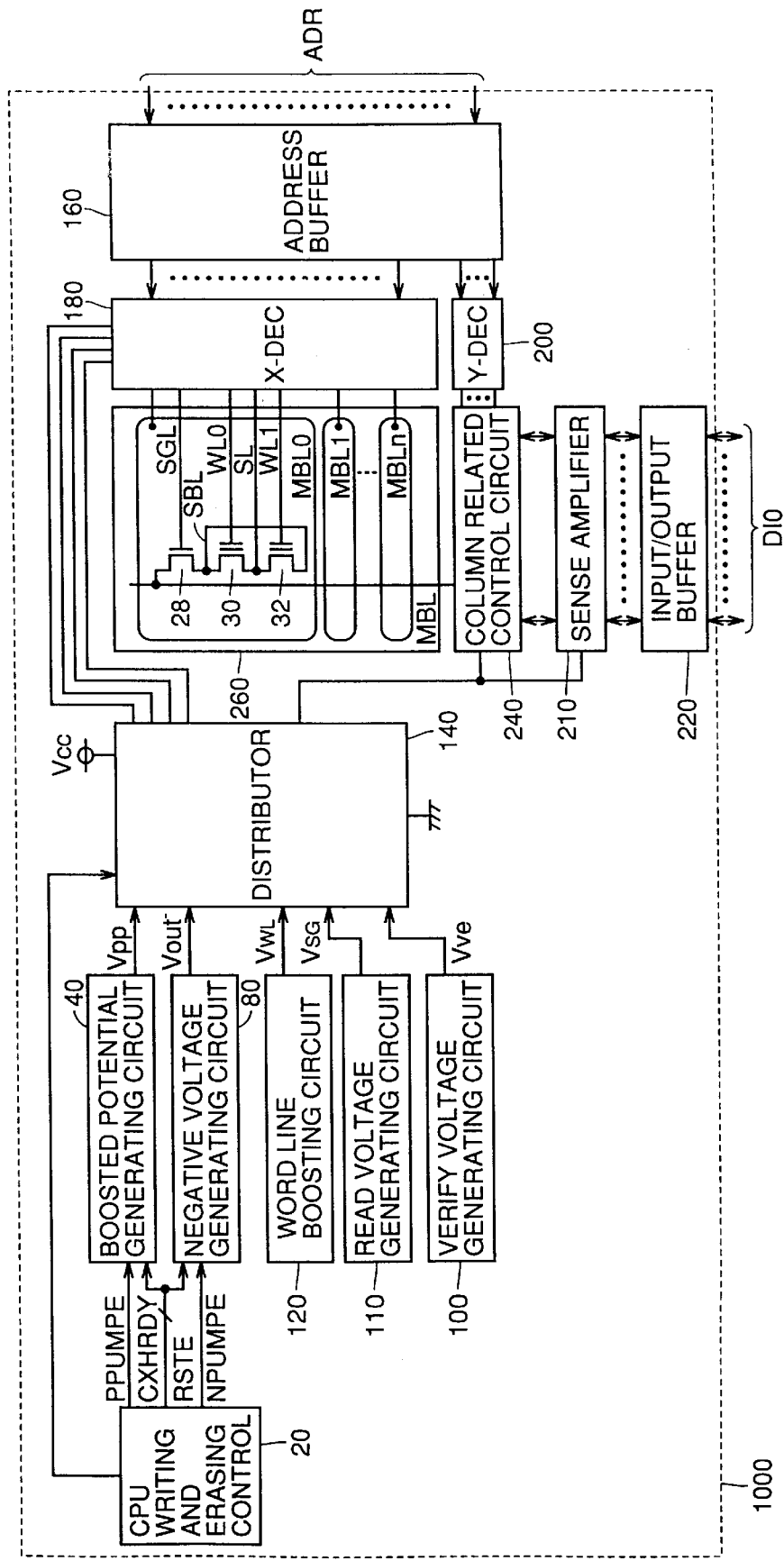
FIG. 1 is a schematic block diagram showing a structure of a nonvolatile semiconductor memory device 1000 of the present invention.

FIG. 1 is a schematic block diagram showing a structure of a nonvolatile semiconductor memory device 1000 of the present invention.

Referring to FIG. 1, semiconductor memory device 1000 is internally provided with a ROM (Read Only Memory), and includes: a CPU 20 controlling writing and erasing operations in accordance with a program code retained in the ROM and an externally applied command signal; a boosted potential generating circuit 40 controlled by CPU 20 for generating a boosted potential Vpp obtained by boosting a power supply potential Vcc; a negative voltage generating circuit 80 controlled by CPU 20 for generating a negative output potential Vout−; a verify voltage generating circuit 100 generating a verify voltage Vve to be supplied to a word line in a verify operation; a read voltage generating circuit 110 generating a read voltage Vsg to be applied to a gate of a select transistor; a word line boost circuit 120 generating a word line driving potential $V_{WL}$; and a distributor 140 controlled by CPU20 for receiving power supply potential Vcc, ground potential GND, potentials Vpp, Vout−, Vsg and $V_{WL}$ and distributing them to respective internal circuits.

Each of boosted potential generating circuit 40 and negative voltage generating circuit 80 include a charge pump circuit receiving ground potential GND and external power supply potential Vcc for operation.

Semiconductor memory device 1000 further includes a memory cell array 260. Memory cell array 260 includes memory blocks MBL0 to MBLn formed in P wells separated by an N well. The erasing operation of nonvolatile semiconductor memory device 1000 is performed by each of memory blocks MBL0 to MBLn as one unit.

Memory block MBL0 includes memory cells 30 and 32 as well as a select transistor 28. In memory block MBL0, a memory cell corresponding to a select gate line SGL, word lines WL0, WL1, and a source line SL, which are selected by an X decoder 180. In the writing operation, the selected memory cell receives a signal corresponding to data through select gate 28 and a sub bit line SBL from a main bit line MBL and retains data.

FIG. 1 typically shows memory cells 30, 32 and select gate 28 corresponding to selected select gate SGL, word lines WL0, WL1, and source line SL.

More specifically, memory cell array 260 shown in FIG. 1 has a memory cell array structure of a so-called DINOR (Divided bit line NOR) type in which bit lines are hierarchically divided into main bit lines MBL and sub bit lines SBL.

Semiconductor memory device 1000 further includes: an address buffer 160 receiving an address signal ADR; an X decoder 180 receiving an address signal from the address buffer and supplied with a potential from the distributor for determining potentials of select gate line SGL, word lines WL0, WL1, source line SL, and wells; an input/output buffer 220 for inputting and outputting a data input/output signal DIO; a Y decoder 200 receiving and decoding an address signal from address buffer 160; a sense amplifier band 210 including a plurality of sense amplifiers for reading data in a reading operation and determining a threshold value of the selected memory cell transistor in a verify operation; and a column related control circuit 240 applying a high voltage to main bit line MBL corresponding to a data input/output signal in accordance with an output from Y decoder 200, performing column selection in the reading operation, and selectively connecting main bit line MBL and sense amplifiers.

The X decoder includes, while not shown in the drawings, a WL decoder for selecting word lines, an SG decoder for selecting selector gates, a well potential control circuit selectively controlling a potential of a well region corresponding to the selected memory block, and an SL decoder for selecting source lines.

Column related control circuit 240 includes a page buffer having a latch circuit and determining as to whether a high voltage is applied to main bit line MBL in the writing operation in accordance with the latched data.

WL boost circuit 120 generates a boosted potential to be applied to word line WL that is selected in the reading operation for rapid access, and read voltage generating circuit 110 generates a boosted potential to be applied to selected select gate SG.

Figure 2:
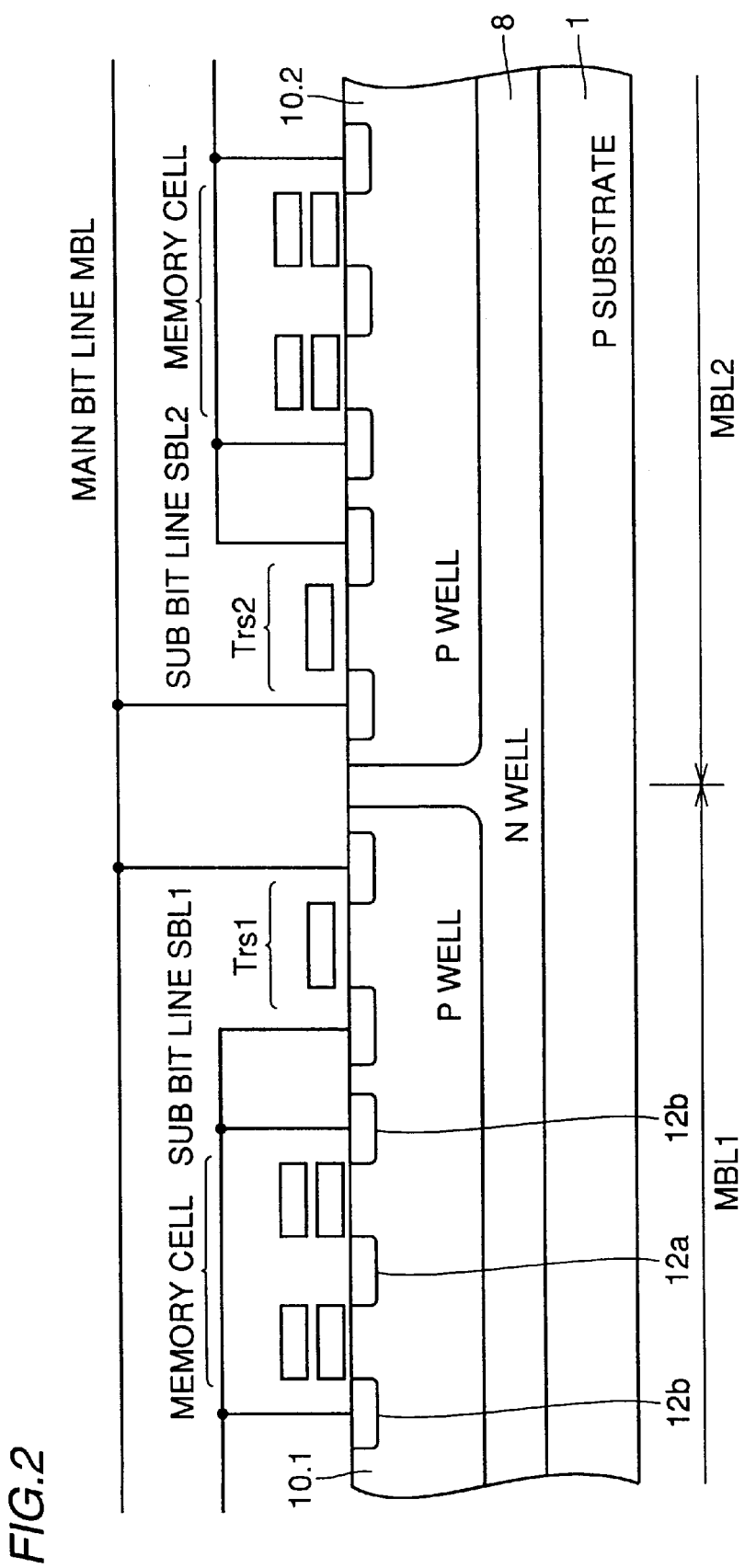
FIG. 2 is a cross sectional view showing a structure of a memory cell array of nonvolatile semiconductor memory device 1000 of the first embodiment of the present invention.

FIG. 2 is a cross sectional view of the memory cell array of nonvolatile semiconductor memory device 1000 of the first embodiment shown in FIG. 1. The structure corresponding to memory blocks MBL1 and MBL2 of FIG. 1 is shown in FIG. 2.

Referring to FIG. 2, in nonvolatile semiconductor memory device 1000 of the first embodiment, a P well in which select transistor Trs1 is formed is formed as P well 10.1 in which the corresponding memory cell block is formed. The same applies to select transistor Trs2.

Further, the wells in memory cell blocks of different data writing units are separated by N well 8. Select transistor Trs1 or Trs2 has its drain connected to corresponding main bit line MBL, and select transistor Trs1 or Trs2 has its source connected to corresponding sub bit line SBL1 or SBL2.

In the erasing operation, a boosted potential Vpp (up to 10V) is applied to the P well, for example P well 10.1, and N well 8 of the selected memory cell. On the other hand, ground potential GND (0V) is applied to P well 10.2 of non-selected memory cell block MBL2.

At the time, boosted potential Vpp applied to P well 10.1 of selected memory cell block MBL1 is transmitted to main bit line MBL as a forward voltage is applied to a PN junction including a drain (N type) of select transistor Trs1 and P well 10.1 of selected memory cell block MBL1.

More specifically, while the potential of main bit line MBL attains to boosted potential Vpp in the erasing operation, ground potential GND (0V) is applied to a gate of select transistor Trs2 of non-selected memory block MBL2, so that potential Vpp of such a main bit line MBL would not be transmitted to sub bit line SBL2 of non-selected memory cell block MBL2.

On the other hand, the gate potential of select transistor Trs1 of selected memory cell block MBL1 is set for example at boosted potential Vpp. Thus, boosted potential Vpp is applied to the drain of the memory cell and the P well in the selected memory cell block, so that electrons are extracted from a floating gate 14 to P well 10.1 for the erasing operation.

Such a structure enables formation of select transistors Trs1 and Trs2 in the same well as the memory cell of the corresponding memory block. Accordingly, the area of the well separation region can be reduced as compared with the conventional structure shown in FIG. 19.

As a result, a considerable reduction in area of the memory cell array and chip size is achieved.

Second Embodiment

A nonvolatile semiconductor memory device of the second embodiment is different from nonvolatile semiconductor memory device 1000 of the first embodiment in the structure of well potential control circuit 188 included in X decoder 180 for selectively controlling the well potential.

More specifically, in the structure for erasing data recorded in the memory cell by extracting electrons from the back gate as described with reference to FIG. 2, N well 8 is formed between P substrate 1 and P well 10 for separation thereof.

In the structure shown in FIG. 2, during the erasing operation, upon application of boosted potential Vpp to the P well of the memory cell block to be erased, boosted potential Vpp is also applied to the N well.

However, as N well 8 is shared by a plurality of memory cell blocks, a junction capacity between P substrate 1 and P well 10 is large. Thus, the potential of N well 8 may be boosted to boosted potential Vpp after the potential of P well 10 in the selected block is boosted to boosted potential Vpp.

Figure 3:
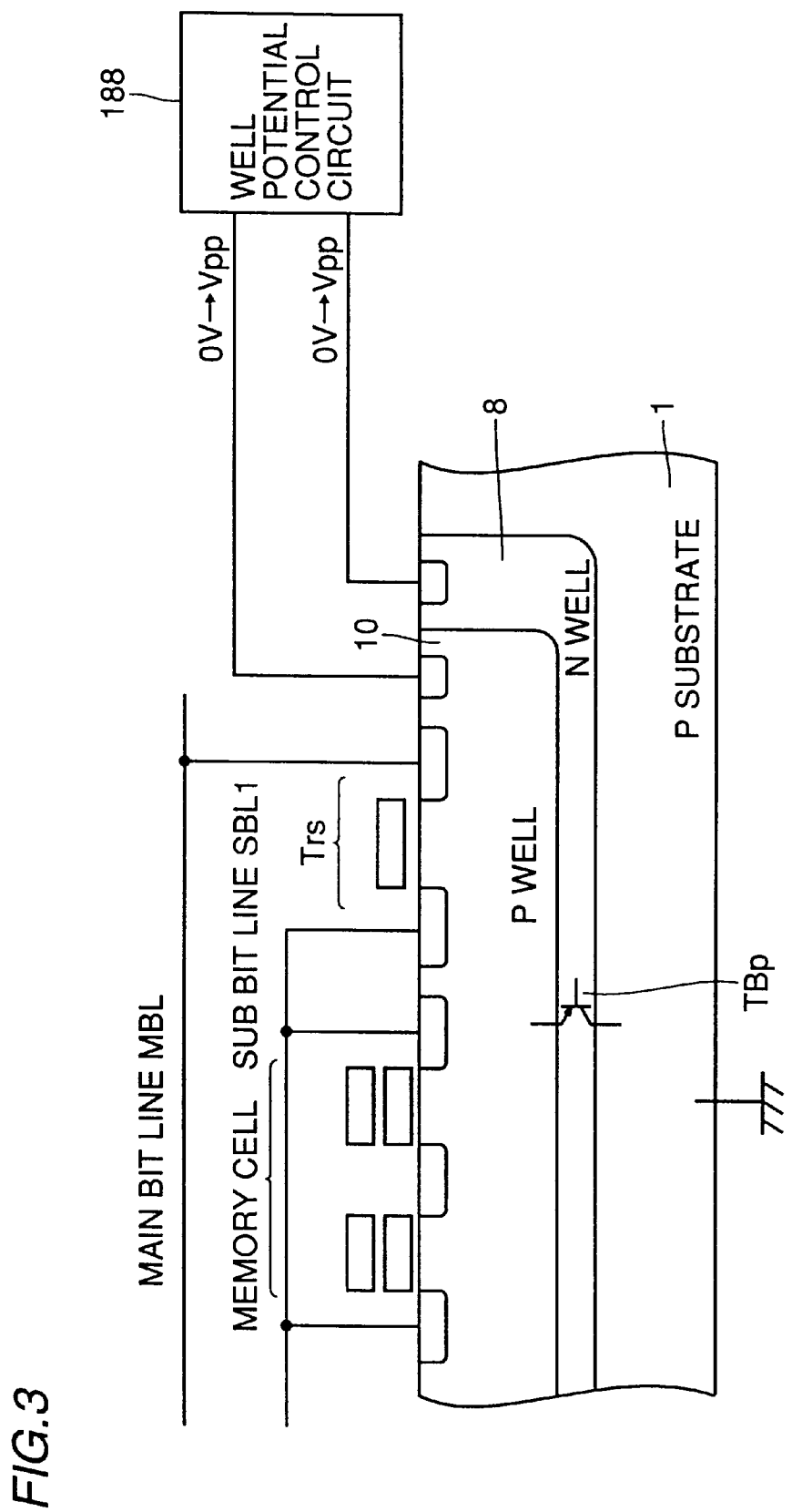
FIG. 3 is a schematic diagram shown in conjunction with an operation of boosting a potential of P well 10 from ground potential GND (0V) to boosted potential Vpp and boosting a potential of N well 8 from power supply potential Vcc to boosted potential Vpp.

FIG. 3 is a schematic diagram shown in conjunction with an operation of boosting the potential of P well 10 from ground potential GND (0V) to boosted potential Vpp and boosting the potential of N well 8 from power supply potential Vcc to boosted potential Vpp in the structure shown in FIG. 2.

As shown in FIG. 3, a parasitic bipolar transistor TBp is formed by P well 10, N well 8 and P substrate 1.

Figure 4:
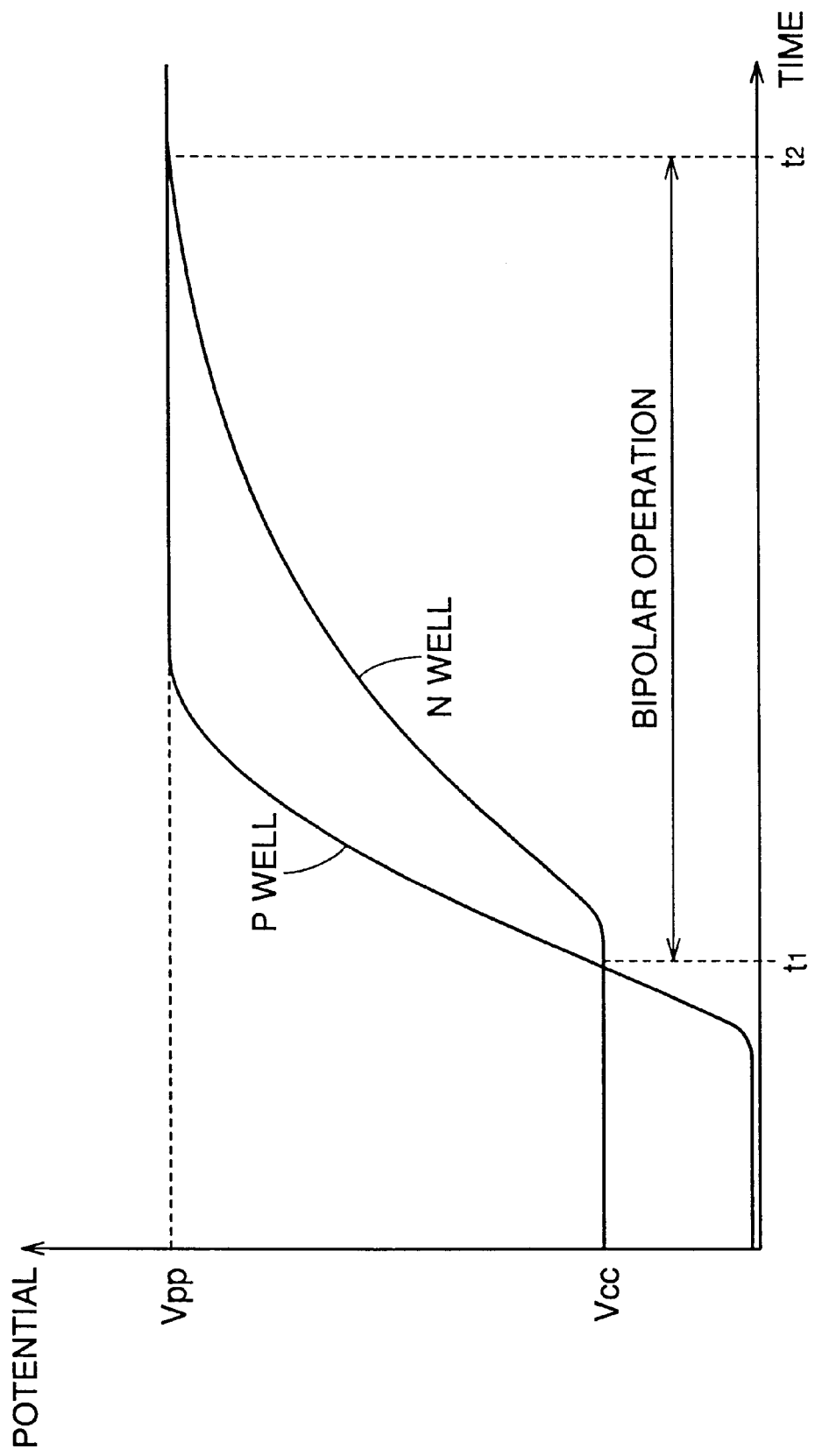
FIG. 4 is a timing chart shown in conjunction with an operation over time of boosting potentials of P well 10 and N well 8 to boosted potential Vpp.

FIG. 4 is a timing chart shown in conjunction with an operation over time of boosting potentials of P well 10 and N well 8 to boosted potential Vpp in the well structure as shown in FIG. 3.

Referring to FIG. 4, as described above, if the potential of N well 8 is boosted after the potential of P well 10, parasitic PNP bipolar transistor BTp between P well 10 and P substrate 1 is rendered conductive, so that P well 10 and P substrate 1 may be electrically rendered conductive between a time t1 and a time t2.

In this case, a current drivability of a charge pump in boosted potential generating circuit 40 for generating boosted potential Vpp is generally low. Accordingly, if P well 10 and P substrate 1 are electrically rendered conductive as described above, output potential Vpp of the charge pump may disadvantageously be lower than a desired value.

Then, in the nonvolatile semiconductor memory device of the second embodiment, in the erasing operation, the potentials of P well 10 and N well 8 are compared and controlled such that the potential of N well 8 is always at least the potential of P well 10.

Figure 5:
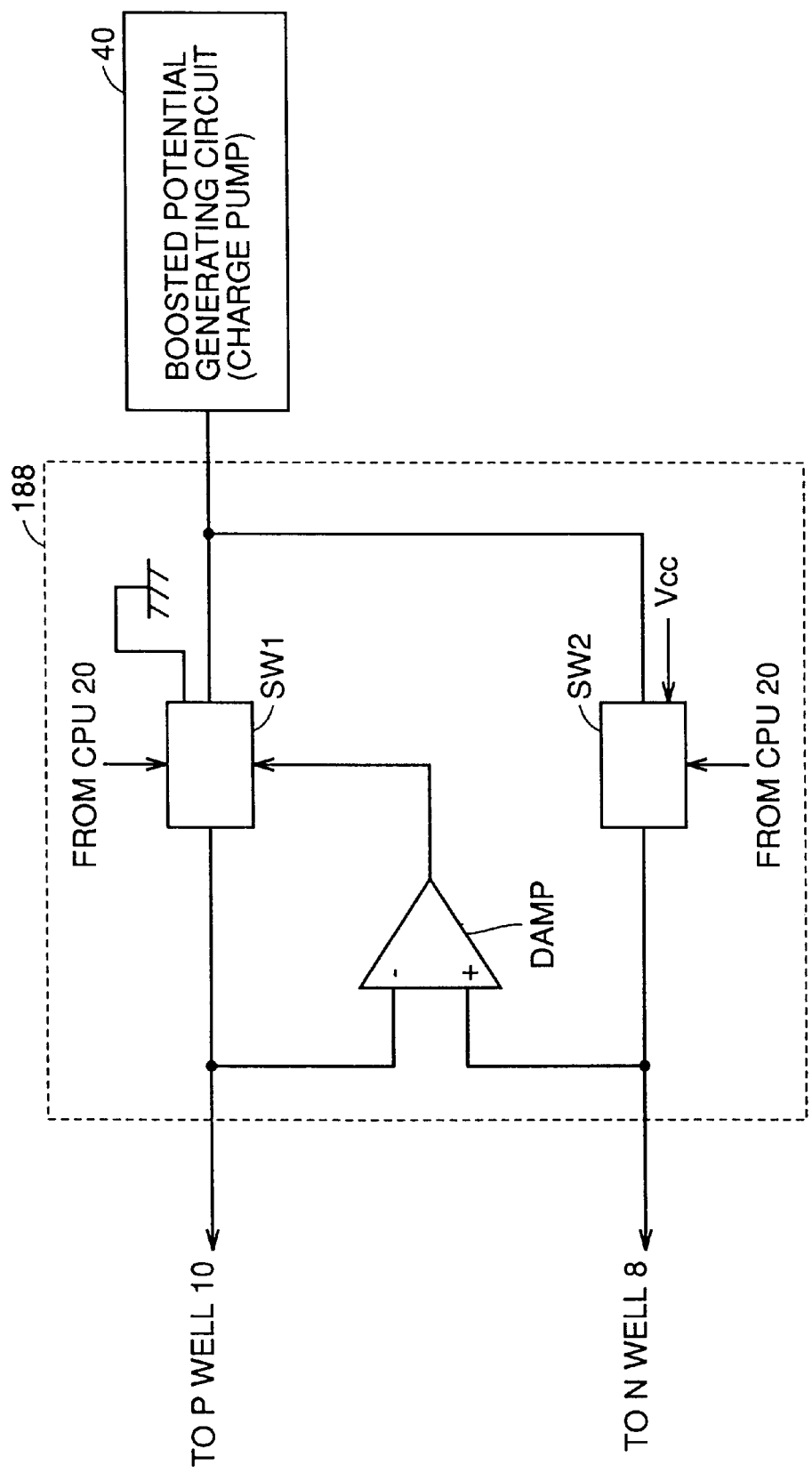
FIG. 5 is a schematic block diagram shown in conjunction with a structure of a well potential controlling circuit 188 of a second embodiment.

FIG. 5 is a schematic block diagram shown in conjunction with a structure of well potential control circuit 188 of the second embodiment. It is noted that the structure corresponding to one of the plurality of memory cell blocks is only shown in FIG. 5.

Well potential control circuit 188 includes: a switching element SW1 receiving an output from the charge pump in boosted potential generating circuit 40 and a ground potential and controlled by CPU20 in accordance with an address signal for selectively applying one of the ground potential and an output from boosted potential generating circuit 40 to P well 10; a switching element SW2 receiving the output from the charge pump and power supply potential Vcc for selectively applying one of them to N well 8; and a differential amplifier DAMP receiving potential levels of P well 10 and N well 8 for outputting a signal in an active state when the potential of N well 8 is higher than that of P well 10.

Switching circuits SW1 and SW2 transmit boosted potential Vpp in accordance with a control signal from CPU20. At the time, switching circuit SW1 is designated for transmission of boosted potential Vpp by the control signal from CPU20 and transmits boosted potential Vpp only when an output signal from differential amplifier DAMP is in the active state.

Accordingly, P well 10 is supplied with boosted potential Vpp only when the potential level of N well 8 is higher than that of P well 10.

Figure 6:
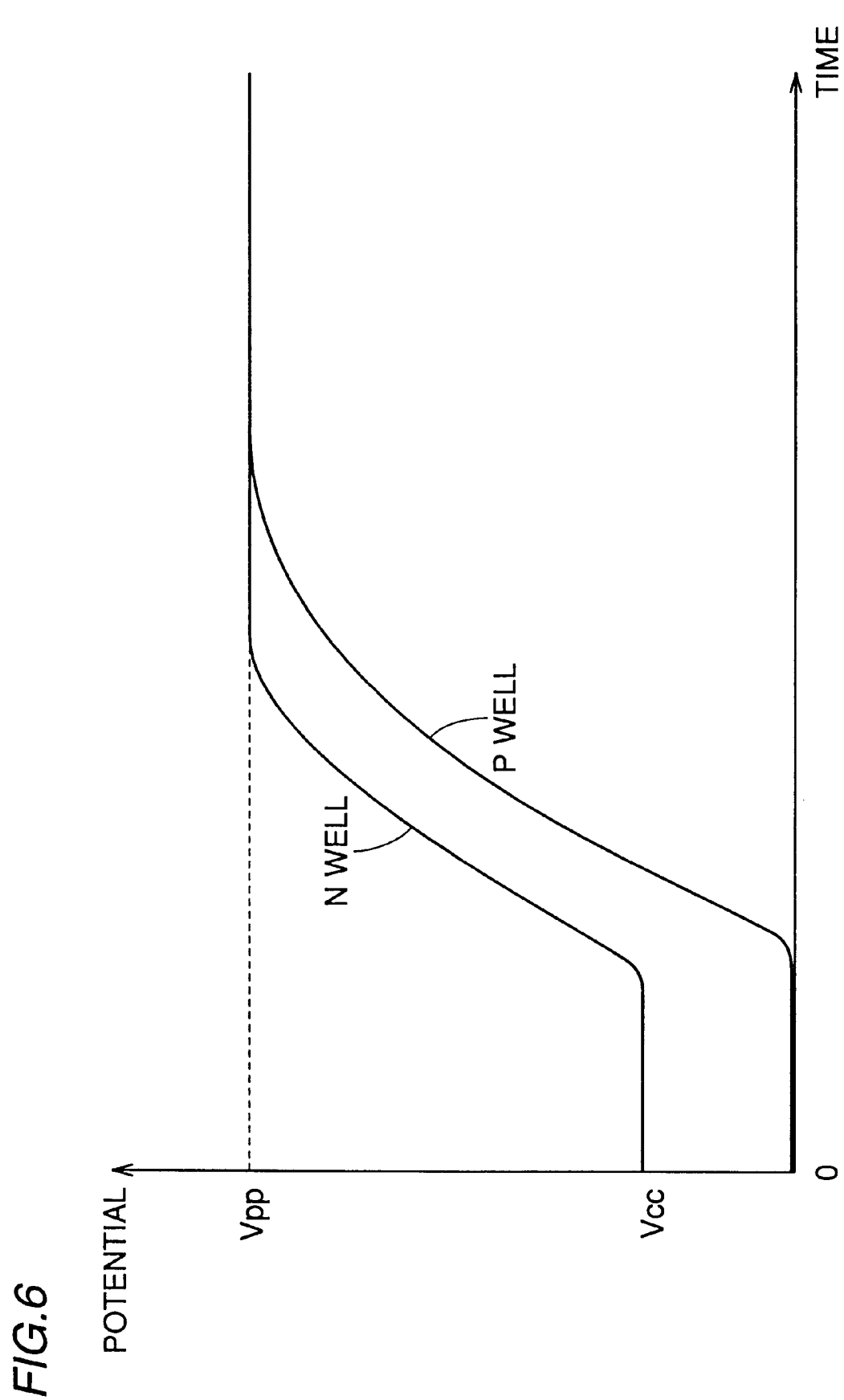
FIG. 6 is a timing chart shown in conjunction with changes in output levels of P well 10 and N well 8 of a selected memory cell block.

FIG. 6 is a timing chart shown in conjunction with changes in output levels of P well 10 and N well 8 in the selected memory cell block during such operation.

Referring to FIG. 6, as the potential level of N well 8 is always higher than that of P well 10, parasitic bipolar transistor BTp is not rendered conductive.

Thus, a high voltage is stably applied to the P well for the stable erasing operation.

In addition, N well 8 can be formed and shared by the larger number of memory blocks. Accordingly, there is no need to divide N well 8 into smaller portions, and an increase in chip area is prevented.

Figure 19:
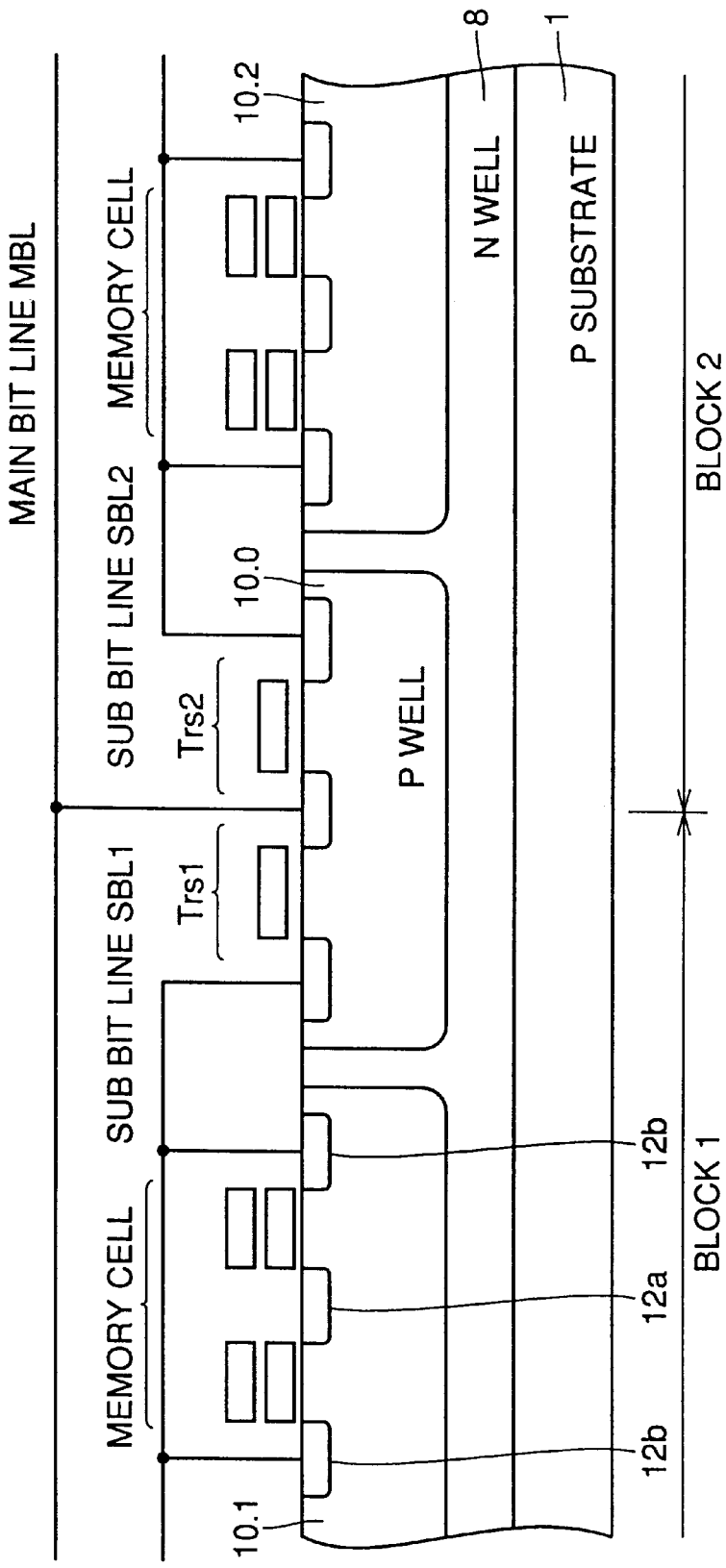
FIG. 19 is a cross sectional view shown in conjunction with a structure of a memory cell array when data is erased by extracting electrons from P well 10 (a back gate).

The second embodiment has been described as having select transistor Trs and the memory cell transistor formed in the same P well 10. However, as shown in FIG. 19, for example, even if select transistor Trs and the memory cell block are formed in separate P wells, the above described structure of the well potential control circuit enables stable erasing operation.

Third Embodiment

For verifying erasing or over-erasing during an erasing operation, a negative voltage may be applied to the back gate of the memory cell to increase threshold voltage Vth of a non-selected memory cell in order to reduce a leakage current of the non-selected memory cell.

Figure 7:
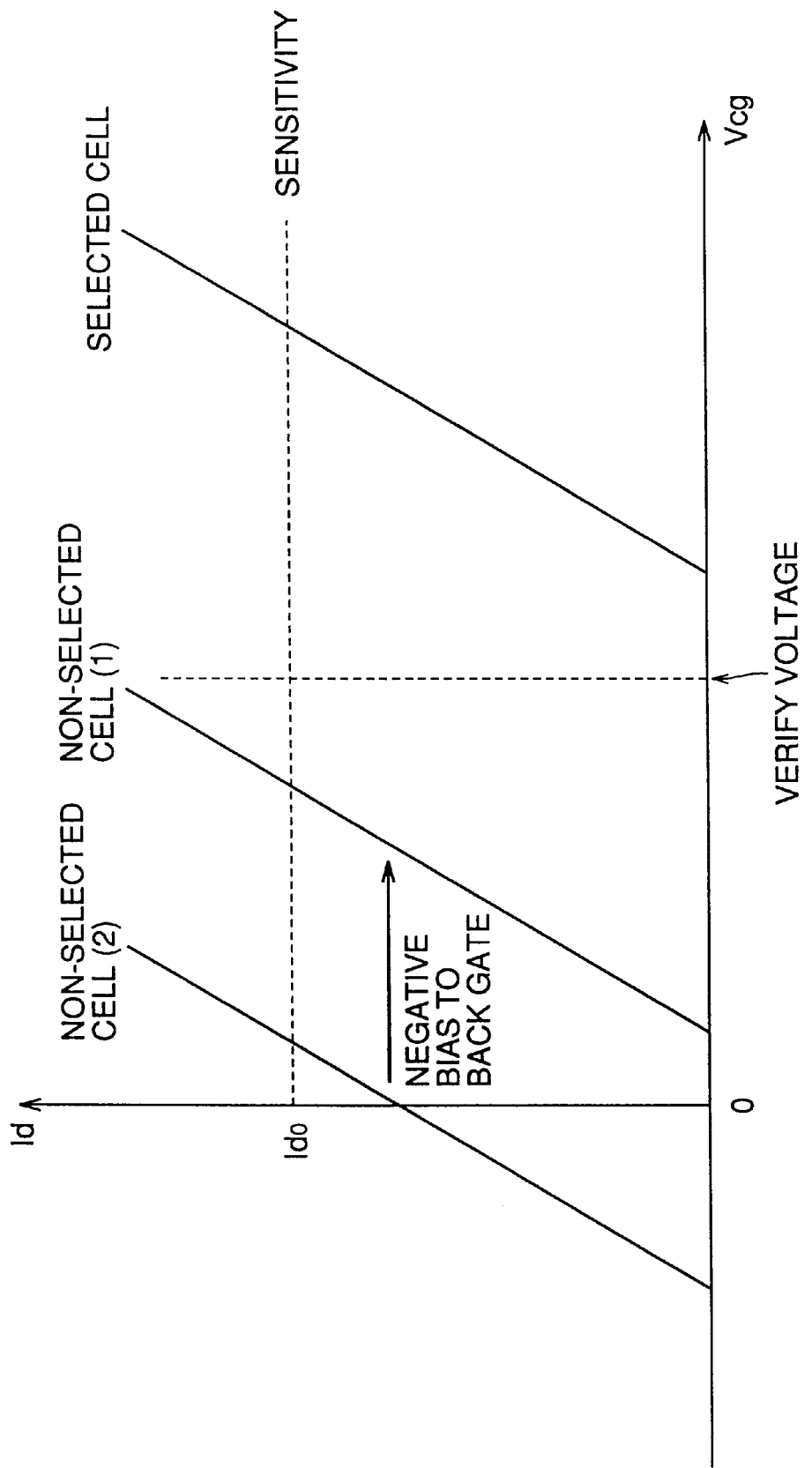
FIG. 7 is a schematic diagram shown in conjunction with changes in threshold voltages of non-selected and selected memory cells.

FIG. 7 is a schematic diagram shown in conjunction with changes in threshold voltage of non-selected and selected memory cells.

Referring to FIG. 7, in the non-selected cell, when a prescribed amount of leakage current flows due to over-erasing or the like even if a gate voltage is zero volt, it becomes difficult to perform a normal verify operation (non-selected cell characteristic (2)).

Then, a negative bias is applied to the back gate for the non-selected cell which has been subjected to such over-erasing to increase the threshold voltage, so that the leakage current is reduced (non-selected cell characteristic (1)).

Figure 8:
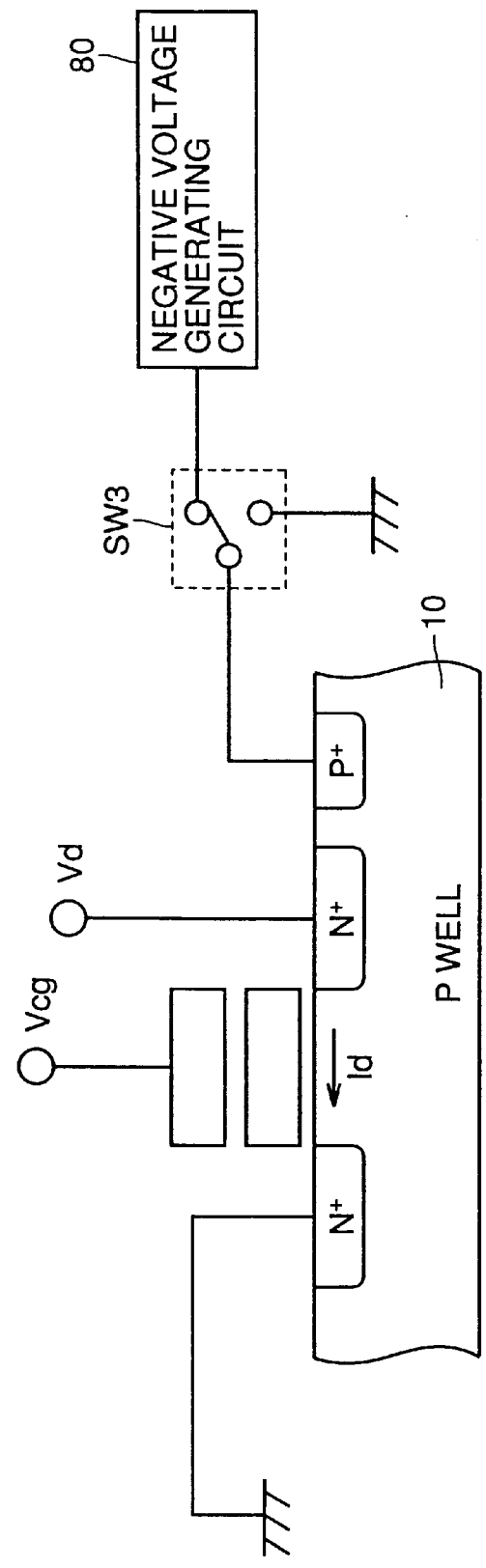
FIG. 8 is a schematic diagram shown in conjunction with a potential applied to a memory cell transistor.

FIG. 8 is a schematic diagram shown in conjunction with a potential applied to the memory cell transistor during such operation.

In the verify operation, ground potential GND is applied to the source of a floating gate type memory cell transistor, a verify voltage Vcg is applied to a control gate (a word line), and a positive voltage Vd (>0V) of a prescribed value is applied to the drain. A negative potential generated by negative potential generating circuit 80 is selectively applied to P well 10 by a switching circuit SW3.

However, if such verify operation is applied to the structure in which the memory cell transistor and select transistor Trs1 (or Trs2) are formed in the same P well as shown in FIG. 2, not only threshold voltage Vth of the memory cell transistor but also that of select transistor Trs1 (or Trs2) increase.

Figure 9:
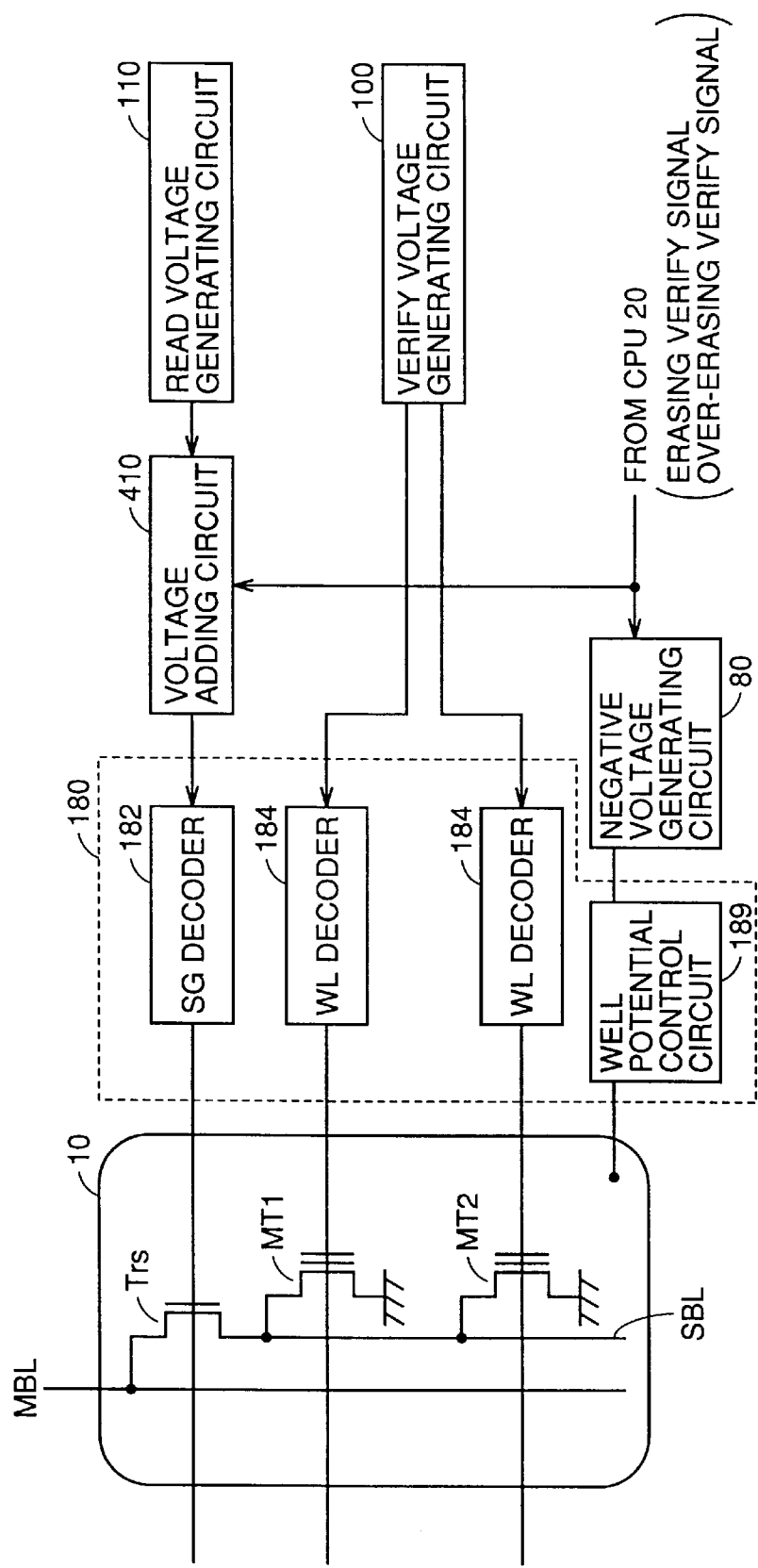
FIG. 9 is a schematic block diagram showing a structure of a nonvolatile semiconductor memory device of a third embodiment capable of coping with a change in threshold voltage of select transistor Trs.

FIG. 9 is a schematic block diagram showing a structure of a nonvolatile semiconductor memory device capable of coping with a change in threshold voltage of select transistor Trs even when a negative bias is applied to P well 10 for the verify operation.

The negative potential generated by negative voltage generating circuit 80 is selectively supplied to P well 10 in which the selected memory cell block is formed by well potential control circuit 189.

In the structure shown in FIG. 9, SG decoder 182 and WL decoder 184 are respectively the same as those included in the X decoder shown in FIG. 1.

Further, in the structure shown in FIG. 9, distributor 140 includes a voltage adding circuit 410 for increasing by a prescribed amount a voltage applied to the SG decoder from the voltage generated by read voltage generating circuit 110.

More specifically, the voltage applied to the gate of select transistor Trs during the verify operation is increased by an amount of increase in threshold voltage of select transistor Trs by voltage adding circuit 410.

While not limited, such an increase in voltage is for example achieved by a circuit that comprises a voltage limiter having a diode connected N-channel MOS transistor. The diode-connected N-channel MOS transistor has the same conductivity as the select transistor Trs and is formed in the P well 10 that has the memory cell transistors MT1 and MT2 to be subjected to the verify operation.

Accordingly, a stable verify operation can be achieved while reducing a leakage current in the memory cell.

Fourth Embodiment

The structure of a nonvolatile semiconductor memory device according to the fourth embodiment is different from that of the first embodiment in that the sensitivity of the sense amplifier can be changed.

In the above described third embodiment, a voltage applied to the gate of select transistor Trs during the verify operation is set higher by an amount of increase in threshold value of select transistor Trs.

In the fourth embodiment, the gate voltage of select transistor Trs during the verify operation is the same as that during a normal reading operation as in the case of the first embodiment.

However, a sensitivity (a threshold current of the drain current flowing through the memory cell transistor in determining the level stored in the memory cell) of the sense amplifier for the verify operation can be set at a value higher by an amount of increase in threshold voltage Vth.

More specifically, since the threshold voltage of select transistor Trs is higher, if the gate potential which is the same as that during the reading operation is simply applied to select transistor Trs, it may erroneously be determined that the erasing operation has been completed before the threshold value of the memory cell transistor is sufficiently decreased because the current flowing through select transistor Trs is reduced.

Figure 10:
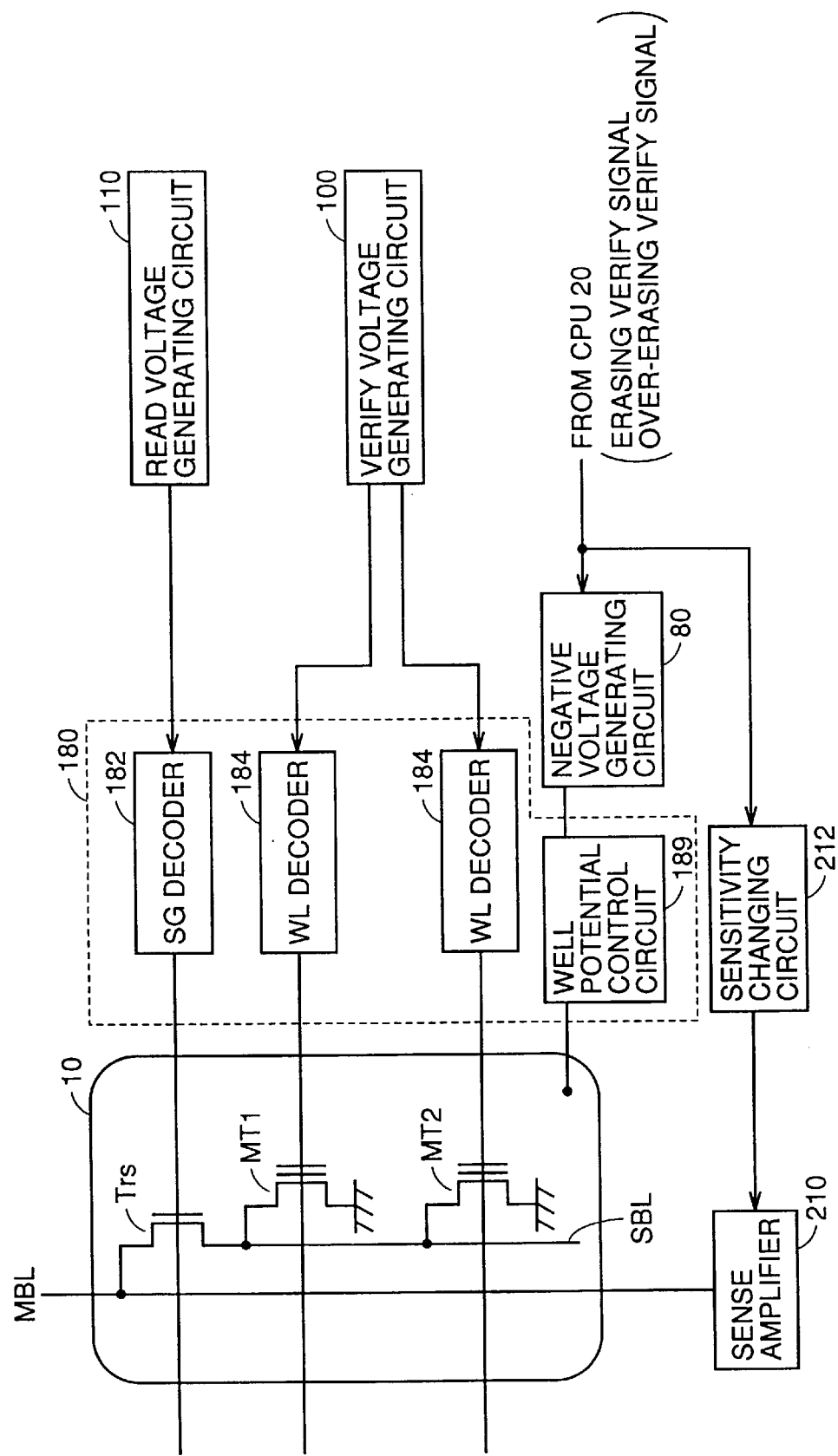
FIG. 10 is a schematic block diagram showing a structure of a nonvolatile semiconductor memory device of a fourth embodiment capable of coping with a change in threshold voltage of select transistor Trs.

FIG. 10 is a schematic block diagram showing the structure of the nonvolatile semiconductor memory device of the fourth embodiment capable of coping with the change in threshold voltage of select transistor Trs even when the verify operation is performed by applying a negative bias to P well 10. During the verify operation, the sensitivity of sense amplifier 210 is controlled by CPU20 and changed by a sensitivity changing circuit 212.

Figure 11:
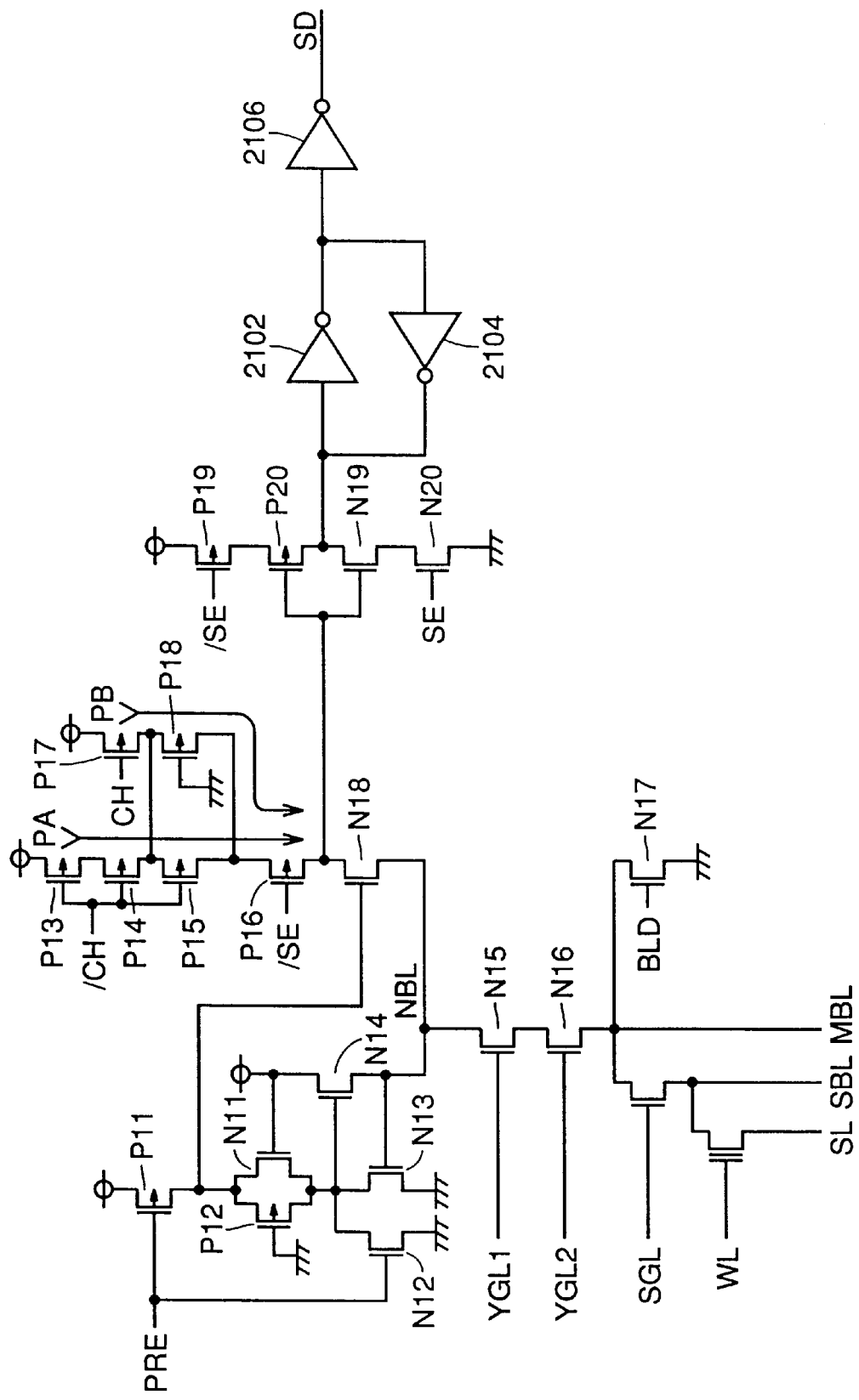
FIG. 11 is a circuit diagram shown in conjunction with exemplary structures of a sense amplifier 210 and a sensitivity changing circuit 212 shown in FIG. 10.

FIG. 11 is a circuit diagram showing exemplary structure of sense amplifier 210 and sensitivity changing circuit 212 shown in FIG. 10.

Referring to FIG. 11, sense amplifier 210 and sensitivity changing circuit 212 include a P channel MOS transistor P11 and N channel MOS transistors N11, N13 connected in series between power supply potential Vcc and ground potential GND. Transistor P11 has its gate receiving a precharge signal PRE.

P channel MOS transistor P12 having its gate receiving the ground potential is arranged in parallel with transistor N11, and N channel MOS transistor P13 having its gate receiving precharge signal PRE is arranged in parallel with transistor N13.

Sense amplifier 210 and sensitivity changing circuit 212 further include N channel MOS transistors N14, N15 and N16 connected in series between power supply potential Vcc and main bit line MBL.

A source of transistor N14 connected to power supply potential Vcc is connected to the gate of transistor N11, and the drain of transistor N14 connected to an internal node NBL is connected to the gate of transistor N13.

Transistors N15 and N16 are included in a corresponding Y gate portion and have their gates respectively receiving signals YGL1 and YGL2 from Y decoder 200.

Sense amplifier 210 and sensitivity changing circuit 212 further include P channel MOS transistors P13, P14, P15, and P16 as well as an N channel MOS transistor N18, which are connected in series between power supply potential Vcc and internal node NBL. Transistors P13, P14, and P15 have their gates receiving signals/CH in the active state (at the "L" level) during a normal reading operation. Transistor P16 has its gate receiving a signal/SE in the active state (at the "L" level) designating activation of a sensing operation.

Sense amplifier 210 and sensitivity changing circuit 212 further include P channel MOS transistors P17 and P18 connected in series between power supply potential Vcc and a connection node of transistors P15 and P16. The gate of transistor P17 is in the inactive state ("H" level) during a normal reading operation, and receives a signal CH brought into the active state ("L" level) during the verify operation. Transistor P18 has its gate connected to the ground potential.

Accordingly, current is supplied through a path PA shown in FIG. 11 during the normal reading operation, whereas current is supplied through a path PB during the verify operation.

Sense amplifier 210 and sensitivity sensing circuit 212 further include P channel MOS transistors P19 and P20 as well N channel MOS transistors N19 and N20 connected in series between power supply potential Vcc and the ground potential. Transistor N19 receives a signal/SE, and transistor N19 has its gate receiving a signal SE which is an inverted signal of signal/SE. Transistors P20 and N19 both have their gates connected to a connection node of transistors P16 and N18.

Sense amplifier 210 and sensitivity changing circuit 212 further include: an inverter 2102 having its input node connected to the connection node of transistors P20 and N19; an inverter 2104 having its input node connected to an output node of inverter 2102 and having its output node connected to the input node of inverter 212 to form a latch circuit; and an inverter 2106 receiving an output from inverter 2102 for outputting a read data SD.

It is noted that transistor N17 is rendered conductive in accordance with a signal BLD and, for example, discharges current from the bit line which has a high voltage during the erasing operation.

Because of such structures of sense amplifier 210 and sensitivity changing circuit 212, if a larger amount of current is supplied to the memory cell transistor during the verify operation, the level of read data SD would not be inverted.

Therefore, the sensitivity of the sense amplifier is set to determine the level using a higher current value as a threshold value, so that an increase in threshold value of select transistor Trs can be compensated.

Fifth Embodiment

Figure 12:
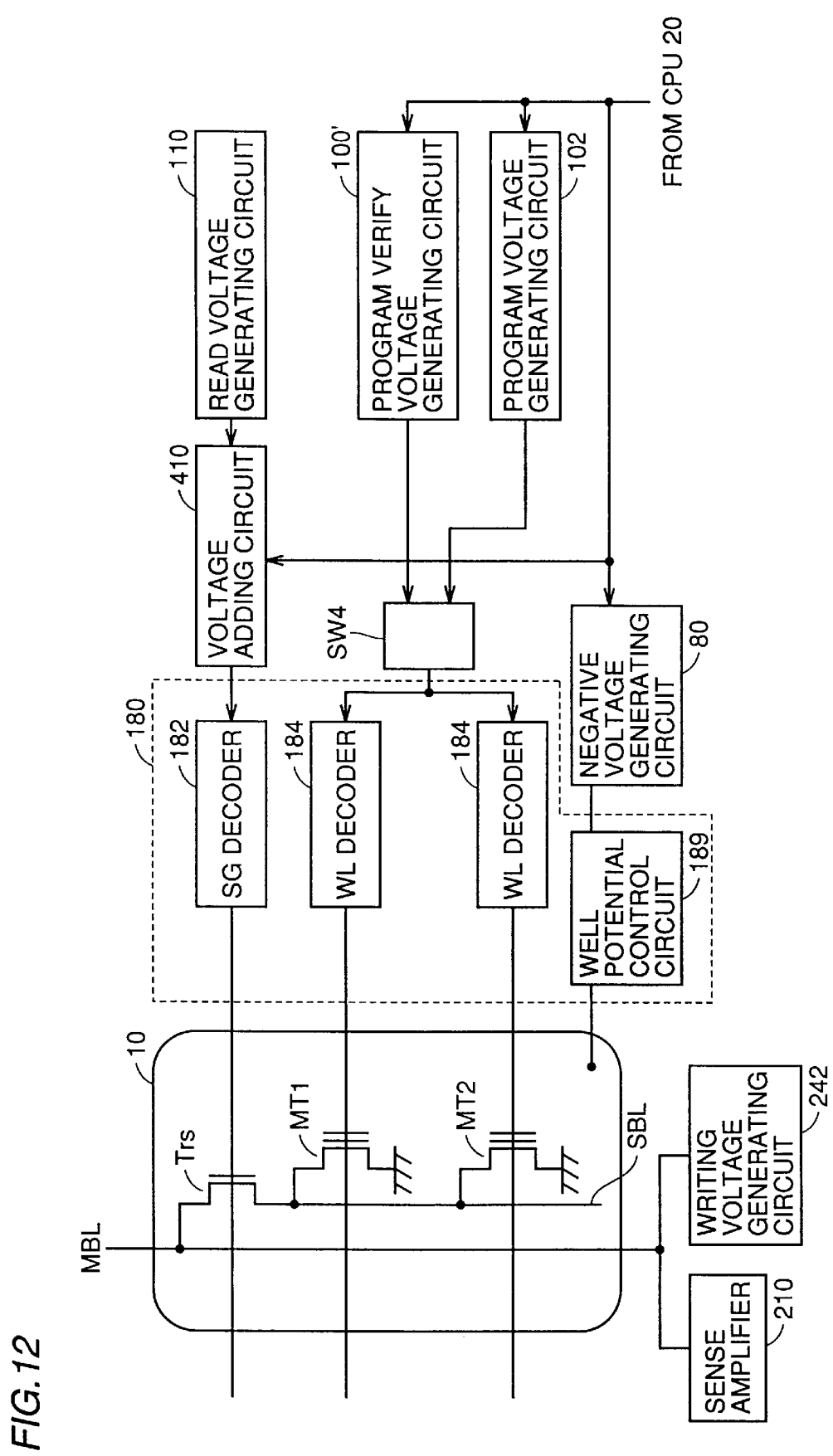
FIG. 12 is a schematic block diagram shown in conjunction with a structure of a nonvolatile semiconductor memory device of a fifth embodiment of the present invention.

FIG. 12 is a schematic block diagram showing a structure of a nonvolatile semiconductor memory device according to the fifth embodiment of the present invention. The nonvolatile semiconductor memory device of the fifth embodiment is different from that of the first embodiment in potentials applied to P well 10 and the gate of select transistor Trs during the programming operation.

In the nonvolatile semiconductor memory device of the fifth embodiment, first, the voltage to be applied to the gate of select transistor Trs is generated by read voltage generating circuit 110 during the normal reading operation, whereas a boosted potential is applied by voltage adding circuit 410 during the programming operation and program verify operation.

Further, voltages from a program verify voltage generating circuit 100 and a program voltage generating circuit 102 are selectively applied to WL decoder 184 through a switching circuit SW4.

Further, a writing voltage is applied to main bit line MBL from a writing voltage generating circuit 242.

During the programming operation, when a negative bias is applied to the back gate the memory cell transistor, a program efficiency can be enhanced.

In the non-volatile semiconductor memory device according to the fifth embodiment, the above described programming operation is performed, and the gate voltage of select transistor Trs is set higher by an amount of increase in threshold voltage of transistor Trs than during the normal reading operation while applying the negative bias during the program verify operation.

By performing the program verify operation with the voltage applied to the gate of select transistor Trs set higher than a value during the normal reading operation as described above, the negative bias can be applied to the potential of the well both during the programming operation and the program verify operation.

Accordingly, power consumption is reduced and a rapid programming operation can be performed.

Sixth Embodiment

In the structure of the fifth embodiment, the negative bias is applied to P well 10 and the potential applied to the gate of select transistor Trs is set higher by an amount of increase in threshold voltage of select transistor Trs during the program verify operation.

Figure 13:
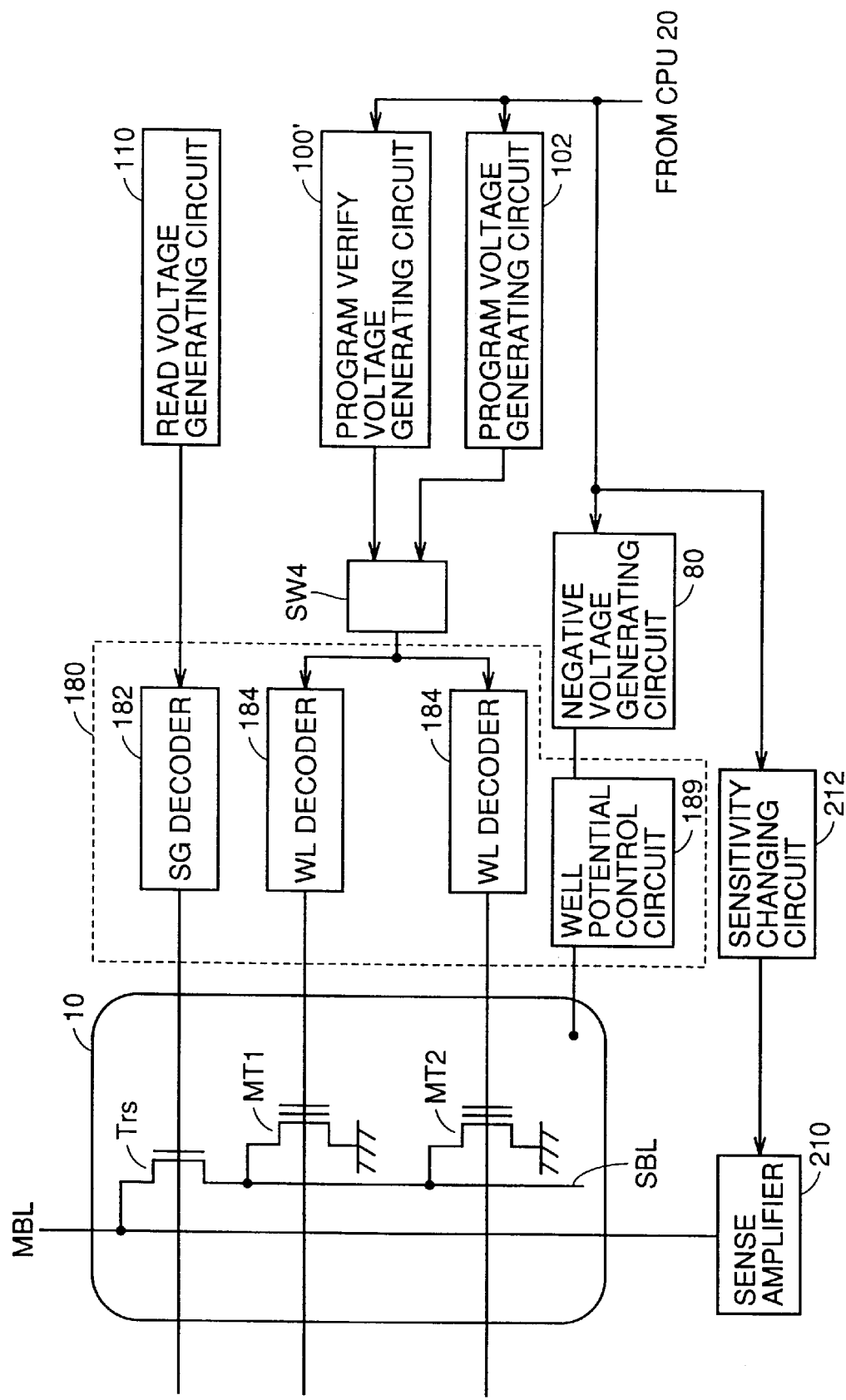
FIG. 13 is a schematic block diagram shown in conjunction with a structure of a nonvolatile semiconductor memory device of a sixth embodiment of the present invention.

FIG. 13 is a schematic block diagram showing a structure of a nonvolatile semiconductor memory device according to the sixth embodiment of the present invention.

In the non-volatile semiconductor memory device of the sixth embodiment, the voltage applied to the gate of select transistor Trs during the program verify operation is the same as that during the reading operation.

As in the fourth embodiment, during the program verify operation, sense amplifier sensitivity changing circuit 212 changes the sensitivity of sense amplifier 210 in accordance with a program signal and a program verify signal from CPU 20 to set the sensitivity of the sense amplifier higher by an amount of increase in threshold voltage of select transistor Trs during the program verify operation.

Such a structure enables an increase in efficiency of the program and a reduction in power consumption as well as rapid programming operation as in the case of the fifth embodiment.

Seventh Embodiment

In the erasing operation, a boosted potential Vpp is applied to main bit line MBL and sub bit line SBL through a drain of select transistor Trs corresponding to the selected memory block.

Accordingly, to reset the erasing voltage after applying boosted potential Vpp to P well 10.1 for the erasing operation, potentials of P well 10.1 and N well 8 must respectively be set at ground potential (0V) and power supply potential Vcc. In addition, potential levels of main bit line MBL and sub bit line SBL, which have been precharged to boosted potential Vpp as described above, must be reset by reset transistor Tres.

Figure 14:
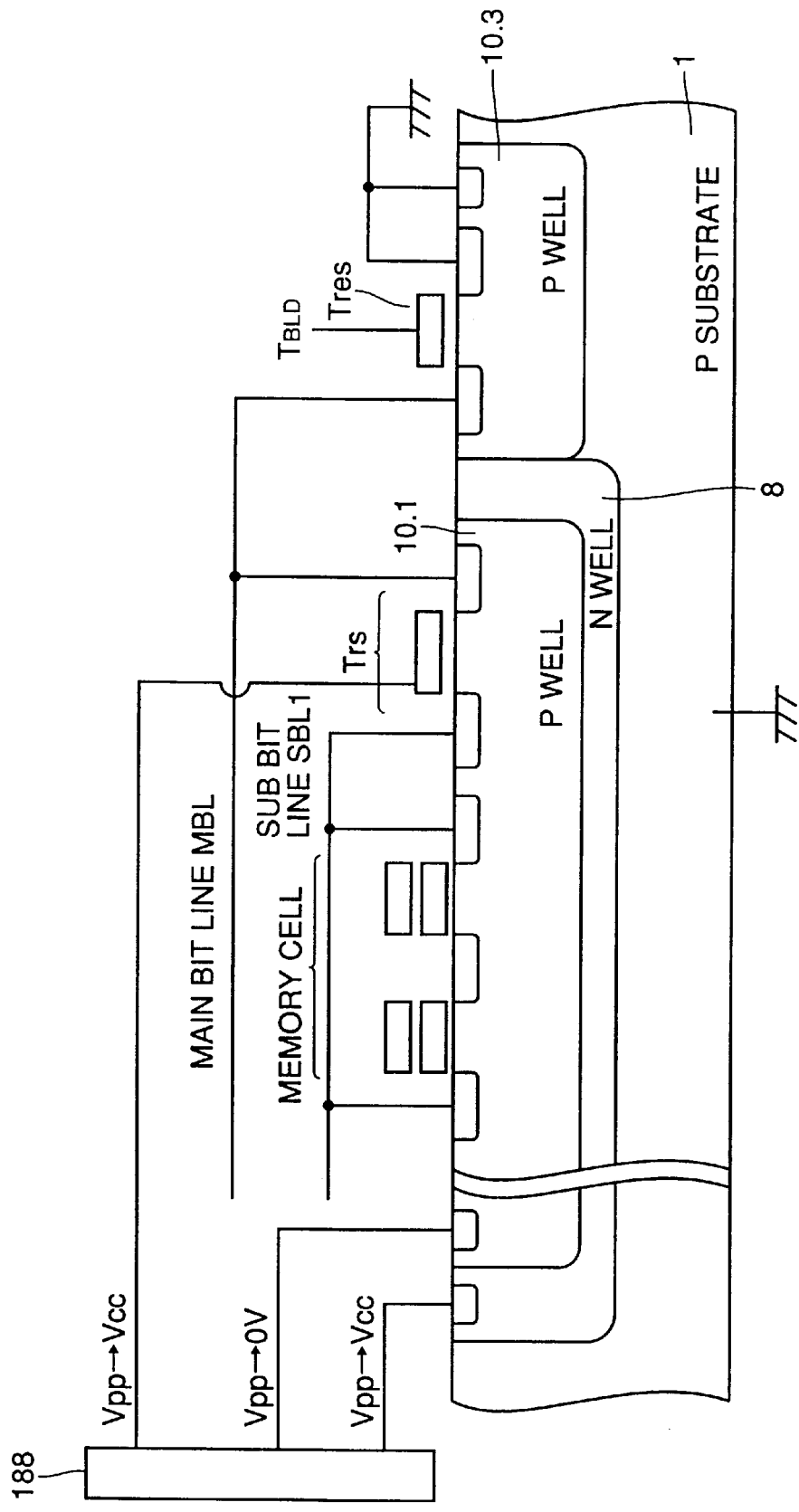
FIG. 14 is a cross sectional view showing a structure of a reset transistor Tres for resetting main bit line MBL and sub bit line SBL.

FIG. 14 is a cross sectional view showing a structure of a reset transistor Tres for resetting the above described main bit line MBL and sub bit line SBL.

CPU 20 controls an operation of P well potential control circuit 188 controlling potentials of the gate of the reset transistor, P well 10.1, and gates of N well 8 and select transistor Trs.

At the time, during a potential resetting operation after such an erasing operation, CPU 20 controls to reset the order of resetting potentials of P well 10.1, N well 8, main bit line MBL, and sub bit line SBL, in the order of the P well, the N well, main bit line MBL, and sub bit line SBL. Here, to reset the potential of sub bit line SBL which has been precharged to potential Vpp, the gate potential of select transistor Trs must be maintained at a high level and transistor Trs must be in an on state during the resetting period. Thus, the potential of sub bit line SBL can be reset by bit line reset transistor Tres through select transistor Trs.

The above described control prevents forward bias to any of PN junctions.

Accordingly, the potential level would not fluctuate by introduction of electric charges from the forward-biased PN junctions, so that a stable erasing operation is ensured.

Figure 15:
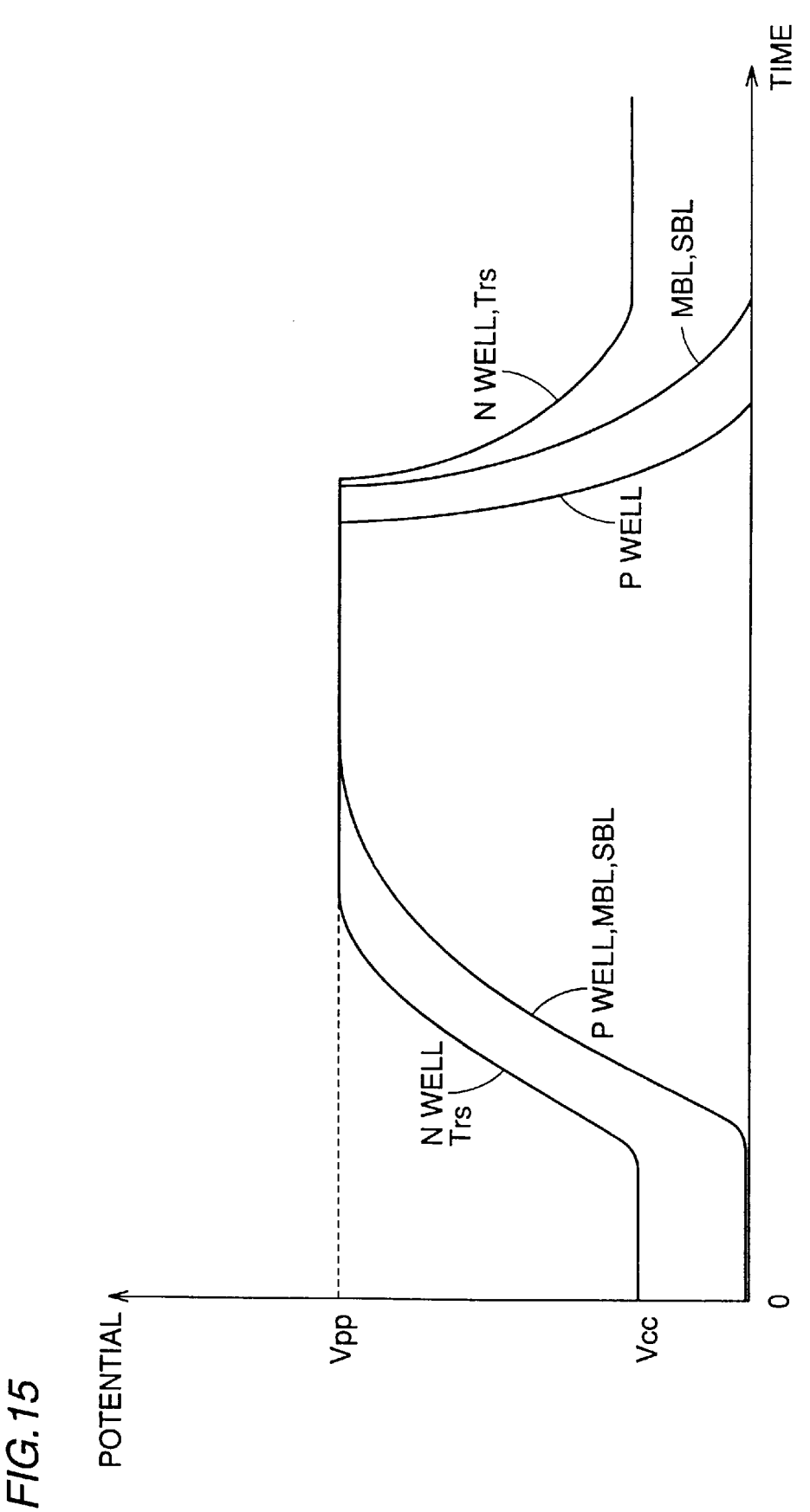
FIG. 15 is a timing chart shown in conjunction with changes in potential levels of an N well, P well, and main and sub bit lines MBL and SBL during an erasing operation.
Figure 16:
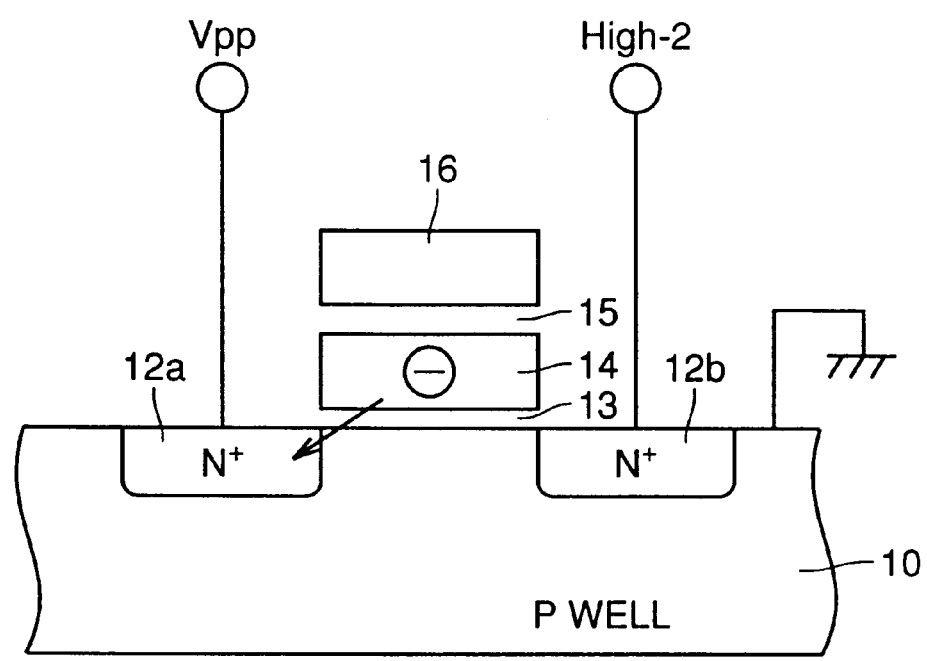
FIG. 16 is a schematic diagram shown in conjunction with a cross sectional structure of a memory cell transistor of a so-called NOR type flash memory and a first erasing operation thereof.
Figure 17:
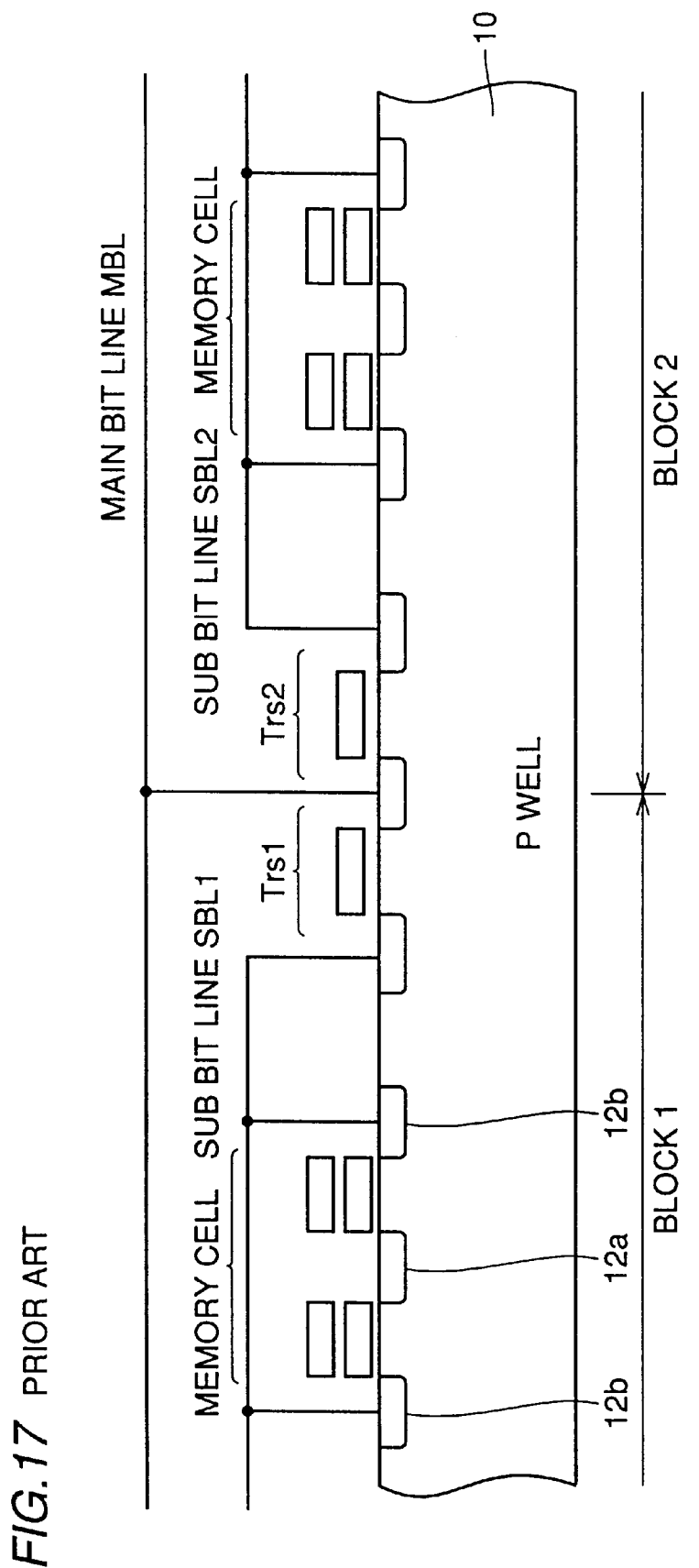
FIG. 17 is a diagram showing a cross sectional view of a memory cell array in which an NOR type flash memory is arranged.
Figure 18:
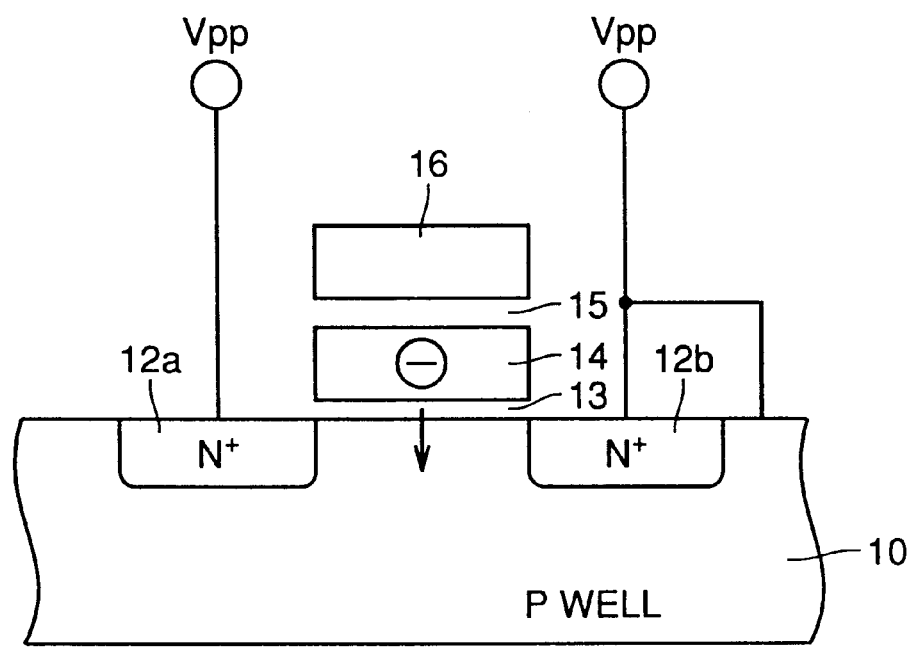
FIG. 18 is a schematic diagram shown in conjunction with a second erasing method of the NOR type flash memory.

FIG. 15 is a timing chart shown in conjunction with changes in potential levels of the N well, P well, main bit line MBL, and sub bit line SBL during the above described erasing operation.

Between time t1 and time t2, the potential level of the N well is controlled to be higher than those of the P well, main bit line MBL, and sub bit line SBL, so that the potential level of the N well attains to boosted potential Vpp and the potential levels of the P well, main bit line MBL and sub bit line SBL also attain to boosted potential Vpp.

Thereafter, in the resetting operation after the erasing operation starting from time t3, initially, the potential level of the P well is reset to 0V. Successively, the potential levels of main bit line MBL and sub bit line SBL are reset to 0V by the reset transistor. Finally, the potential level of the N well is reset to power supply potential Vcc. Referring to FIG. 15, by way of example, the potential level of the P well is initially reset. Thereafter, the potential levels of main bit line MBL and sub bit line SBL are reset, and the potential level of the N well is reset. However, the order of resetting the potential levels of the N well and main and sub bit lines MBL and SBL may be reversed.

As a result, a stable erasing operation and resetting operation can be ensured.

It is noted that, in the above description, the memory cell transistor is an N channel transistor which is formed in the P well. However, the present invention is not limited to the above described structure. Even if the conductivity of the memory cell transistor is of an opposite polarity, the conductivity type of the substrate, well or the like may accordingly be changed and the polarity of the potential applied to the transistor may also be changed to produce a similar effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device formed on a main surface of a semiconductor substrate, comprising:

an internal power supply circuit receiving an external power supply potential for generating an internal potential;

a memory cell array including a plurality of memory cell transistors arranged in a matrix and capable of storing data in nonvolatile manner and electrically writing and reading data, said memory cell array being divided into a plurality of memory cell blocks, each memory cell block being collectively subjected to an erasing operation as a unit;

a plurality of first well regions formed in said main surface of said semiconductor substrate, each first well region provided to a corresponding one of said memory cell blocks;

a second well region of a second conductivity type for electrically separating said plurality of first well regions;

a plurality of main bit lines corresponding to columns of said memory cell array and shared by said plurality of memory cell blocks;

a plurality of sub bit lines, each provided to a corresponding column of a corresponding memory cell block and connected to said memory transistors arranged on said corresponding column;

a plurality of select transistors, each provided to a corresponding sub bit line and selectively connecting said corresponding sub bit line and one of said plurality of main bit lines; and a cell selection circuit applying a potential for a conductive state to a gate of the selected one of said plurality of select transistors and applying a potential for a cut-off state to a gate of the non-selected select transistor, each of said select transistors being provided in the same one of said plurality of first well regions as said memory cell transistor connected to said corresponding sub bit line, wherein said internal power supply circuit includes a boosting circuit generating a boosted potential higher than said external power supply potential, and said nonvolatile semiconductor memory device further includes:

a potential setting circuit selectively setting a potential level of said sub bit line to said boosted potential during an erasing operation of said nonvolatile semiconductor memory device, and a well potential control circuit capable of independently controlling potentials of said plurality of first well regions and said second well region, and said well potential control circuit selectively sets potentials of said second well region and said first well region to said boosted potential while controlling to prevent forward bias to a PN junction formed of said first well region and said second well region during said erasing operation.

2. A nonvolatile semiconductor memory device formed on a main surface of a semiconductor substrate, comprising:

an internal power supply circuit receiving an external power supply potential for generating an internal potential;

a memory cell array including a plurality of memory cell transistors arranged in a matrix and capable of storing data in nonvolatile manner and electrically writing and reading data, said memory cell array being divided into a plurality of memory cell blocks, each memory cell block being collectively subjected to an erasing operation as a unit;

a plurality of first well regions formed in said main surface of said semiconductor substrate, each first well region provided to a corresponding one of said memory cell blocks;

a second well region of a second conductivity type for electrically separating said plurality of first well regions;

a plurality of main bit lines corresponding to columns of said memory cell array and shared by said plurality of memory cell blocks;

a plurality of sub bit lines, each provided to a corresponding column of a corresponding memory cell block and connected to said memory transistors arranged on said corresponding column;

a plurality of select transistors, each provided to a corresponding sub bit line and selectively connecting said corresponding sub bit line and one of said plurality of main bit lines; and a cell selection circuit applying a potential for a conductive state to a gate of the selected one of said plurality of select transistors and applying a potential for a cut-off state to a gate of the non-selected select transistor, each of said select transistors being provided in the same one of said plurality of first well regions as said memory cell transistor connected to said corresponding sub bit line, wherein said internal power supply circuit includes:

a negative voltage generating circuit generating a negative potential, and a reading voltage generating circuit generating a potential to be applied to the gate of said select transistor during a reading operation of said nonvolatile semiconductor memory device, and said nonvolatile semiconductor memory device further includes:

a negative potential setting circuit selectively setting the potential level of said first well region to said negative potential during a verify operation in an erasing operation of said nonvolatile semiconductor memory device, and a voltage converting circuit converting an output potential from said reading voltage generating circuit in accordance with a change in threshold value of said select transistor caused in response to a fact that said negative potential is applied to said first well region and applying it to the gate of said select transistor.

3. A nonvolatile semiconductor memory device according formed on a main surface of a semiconductor substrate, comprising:

an internal power supply circuit receiving an external power supply potential for generating an internal potential;

a memory cell array including a plurality of memory cell transistors arranged in a matrix and capable of storing data in nonvolatile manner and electrically writing and reading data, said memory cell array being divided into a plurality of memory cell blocks, each memory cell block being collectively subjected to an erasing operation as a unit;

a plurality of first well regions formed in said main surface of said semiconductor substrate, each first well region provided to a corresponding one of said memory cell blocks;

a second well region of a second conductivity type for electrically separating said plurality of first well regions;

a plurality of main bit lines corresponding to columns of said memory cell array and shared by said plurality of memory cell blocks;

a plurality of sub bit lines, each provided to a corresponding column of a corresponding memory cell block and connected to said memory transistors arranged on said corresponding column;

a plurality of select transistors, each provided to a corresponding sub bit line and selectively connecting said corresponding sub bit line and one of said plurality of main bit lines; and a cell selection circuit applying a potential for a conductive state to a gate of the selected one of said plurality of select transistors and applying a potential for a cut-off state to a gate of the non-selected select transistor, each of said select transistors being provided in the same one of said plurality of first well regions as said memory cell transistor connected to said corresponding sub bit line, wherein said internal power supply circuit includes:

a negative voltage generating circuit generating a negative potential, and a reading voltage generating circuit generating a potential to be applied to the gate of said select transistor during a reading operation and a verify operation of said nonvolatile semiconductor memory device, and said nonvolatile semiconductor memory device further includes:

a plurality of sense amplifiers reading data from selected one of said memory cell transistors and determining a threshold value in accordance with a value of current flowing through said selected memory cell transistor during said verify operation, a negative potential setting circuit selectively setting a potential level of said first well region to said negative potential during a verify operation in an erasing operation of said nonvolatile semiconductor memory device, and a sensitivity changing circuit changing a sensitivity of said sense amplifier in response to a change in threshold value of said select transistor caused by application of said negative potential to said first well region during said verify operation.

4. A nonvolatile semiconductor memory device formed on a main surface of a semiconductor substrate, comprising:

an internal power supply circuit receiving an external power supply potential for generating an internal potential;

a memory cell array including a plurality of memory cell transistors arranged in a matrix and capable of storing data nonvolatile manner and electrically writing and reading data, said memory cell array being divided into a plurality of memory cell blocks, each memory cell block being collectively subjected to an erasing operation as a unit;

a plurality of first well regions formed in said main surface of said semiconductor substrate, each first well region provided to a corresponding one of said memory cell blocks;

a second well region of a second conductivity type for electrically separating said plurality of first well regions;

a plurality of main bit lines corresponding to columns of said memory cell array and shared by said plurality of memory cell blocks;

a plurality of sub bit lines, each provided to a corresponding column of a corresponding memory cell block and connected to said memory transistors arranged on said corresponding column;

a plurality of select transistors, each provided to a corresponding sub bit line and selectively connecting said corresponding sub bit line and one of said plurality of main bit lines; and a cell selection circuit applying a potential for a conductive state to a gate of the selected one of said plurality of select transistors and applying a potential for a cut-off state to a gate of the non-selected select transistor, each of said select transistors being provided in the same one of said plurality of first well regions as said memory cell transistor connected to said corresponding sub bit line, wherein said internal power supply circuit includes:
 a negative voltage generating circuit generating a negative potential, and
 a reading voltage generating circuit generating a potential to be applied to the gate of said select transistor during the reading operation of said nonvolatile semiconductor memory device, and said nonvolatile semiconductor memory device further includes:
 a negative potential setting circuit selectively setting the potential level of said first well region to said negative potential during a programming operation and a program verify operation of said nonvolatile semiconductor memory device, and
 a voltage changing circuit changing an output potential from said reading voltage generating circuit in accordance with a change in threshold value of said select transistor caused by application of said negative potential to said first well region and applying it to the gate of said select transistor during said program verify operation.

5. A nonvolatile semiconductor memory device formed on a main surface of a semiconductor substrate, comprising:

an internal power supply circuit receiving an external power supply potential for generating an internal potential;

a memory cell array including a plurality of memory cell transistors arranged in a matrix and capable of storing data in nonvolatile manner and electrically writing and reading data, said memory cell array being divided into a plurality of memory cell blocks, each memory cell block being collectively subjected to an erasing operation as a unit;

a plurality of first well regions formed in said main surface of said semiconductor substrate, each first well region provided to a corresponding one of said memory cell blocks;

a second well region of a second conductivity type for electrically separating, said plurality of first well regions;

a plurality of main bit lines corresponding to columns of said memory cell array and shared by said plurality of memory cell blocks;

a plurality of sub bit lines, each provided to a corresponding column of a corresponding memory cell block and connected to said memory transistors arranged on said corresponding column;

a plurality of select transistors, each provided to a corresponding sub bit line and selectively connecting said corresponding sub bit line and one of said plurality of main bit lines; and a cell selection circuit applying a potential for a conductive state to a gate of the selected one of said plurality of select transistors and applying a potential for a cut-off state to a gate of the non-selected select transistor, each of said select transistors being provided in the same one of said plurality of first well regions as said memory cell transistor connected to said corresponding sub bit line, wherein said internal power supply circuit includes:
 a negative voltage generating circuit generating a negative potential, and
 a reading voltage generating circuit generating a potential to be applied to the gate of said select transistor during a reading operation, programming operation and program verify operation of said nonvolatile semiconductor memory device, and said nonvolatile semiconductor memory device further includes:
 a plurality of sense amplifiers reading data from selected one of said memory cell transistors and determining a threshold value in accordance with a value of current flowing through said selected one of said memory cell transistors during said program verify operation,
 a negative potential setting circuit selectively setting a potential level of said first well region to said negative potential during said programming operation and said program verify operation, and a sensitivity changing circuit changing a sensitivity of said sense amplifier in response to a change in threshold value of said select transistor caused by application of said negative potential to said first well region during said program verify operation.

6. A nonvolatile semiconductor memory device formed on a main surface of a semiconductor substrate, comprising:

an internal power supply circuit receiving an external power supply potential for generating an internal potential;

a memory cell array including a plurality of memory cell transistors arranged in a matrix and capable of storing data in nonvolatile manner and electrically writing and reading data, said memory cell array being divided into a plurality of memory cell blocks, each memory cell block being collectively subjected to an erasing operation as a unit;

a plurality of first well regions formed in said main surface of said semiconductor substrate, each first well region provided to a corresponding one of said memory cell blocks;

a second well region of a second conductivity type for electrically separating said plurality of first well regions;

a plurality of main bit lines corresponding to columns of said memory cell array and shared by said plurality of memory cell blocks;

a plurality of sub bit lines, each provided to a corresponding column of a corresponding memory cell block and connected to said memory transistors arranged on said corresponding column;

a plurality of select transistors, each provided to a corresponding sub bit line and selectively connecting said corresponding sub bit line and one of said plurality of main bit lines; and a cell selection circuit applying a potential for a conductive state to a gate of the selected one of said plurality of select transistors and applying a potential for a cut-off state to a gate of the non-selected select transistor, each of said select transistors being provided in the same one of said plurality of first well regions as said memory cell transistor connected to said corresponding sub bit line, wherein each of said memory cell transistors includes first and second diffusion layers of said second conductivity type provided opposite to each other through a channel region of said first conductivity type in a surface layer of said semiconductor substrate, and a two-layer gate electrode having a floating gate formed on said channel region of said first conductivity type through a gate insulating film and a control gate insulated from said floating gate, said nonvolatile semiconductor memory device further includes an erasing circuit selectively applying a potential for extracting electric charges from said floating gate toward the side of said channel to said control gate, said first and second diffusion layers, and said first well during an erasing operation, said internal power supply circuit includes:

a boosting circuit generating a boosted potential higher than said external power supply potential, said nonvolatile semiconductor memory device further includes a control circuit controlling an operation of said nonvolatile semiconductor memory device in accordance with a command signal, a reset circuit controlled by said control circuit for selectively resetting potential levels of said main bit line and said sub bit line during a resetting operation after an erasing operation of said nonvolatile semiconductor memory device, and a well potential control circuit controlled by said control circuit for independently controlling and resetting potentials of said plurality of first well regions and said second well regions, and said control circuit selectively resets potentials of said first and second well regions, said main bit line, and said sub bit line while controlling to prevent forward bias to any of PN junctions formed of said first and second well regions as well as of said first well and said first and second diffusion layers.

7. A nonvolatile semiconductor memory device formed on a main surface of a semiconductor substrate, comprising:

an internal power supply circuit receiving an external power supply potential for generating an internal potential;

a memory cell array including a plurality of memory cell transistors arranged in a matrix and capable of storing data in nonvolatile manner and electrically writing and reading data, said memory cell array being divided into a plurality of memory cell blocks, each memory cell block being collectively subjected to an erasing operation as a unit;

a plurality of first well regions formed in said main surface of said semiconductor substrate, each first well region provided to a corresponding one of said memory cell blocks;

a second well region of a second conductivity type for electrically separating said plurality of first well regions;

a plurality of main bit lines corresponding to columns of said memory cell array and shared by said plurality of memory cell blocks;

a plurality of sub bit lines, each provided to a corresponding column of a corresponding memory cell block and connected to said memory transistors arranged on said corresponding column;

a plurality of select transistors, each provided to a corresponding sub bit line and selectively connecting said corresponding sub bit line and one of said plurality of main bit lines; and a cell selection circuit applying a potential for a conductive state to a gate of the selected one of said plurality of select transistors and applying a potential for a cut-off state to a gate of the non-selected select transistor, each of said select transistors being provided in the same one of said plurality of first well regions as said memory cell transistor connected to said corresponding sub bit line, wherein each of said memory cell transistors includes first and second diffusion layers of said second conductivity type provided opposite to each other through a channel region of said first conductivity type in a surface layer of said semiconductor substrate, and a two-layer gate electrode having a floating gate formed on said channel region of said first conductivity type through a gate insulating film and a control gate insulated from said floating gate, said nonvolatile semiconductor memory device further includes an erasing circuit selectively applying a potential for extracting electric charges from said floating gate toward the side of said channel to said control gate, said first and second diffusion layers, and said first well during an erasing operation, said internal power supply circuit includes a boosting circuit generating a boosted potential higher than said external power supply potential, said nonvolatile semiconductor memory device further includes:
- a control circuit controlling an operation of said nonvolatile semiconductor memory device in accordance with a command signal,
- a reset circuit controlled by said control circuit for selectively resetting potential levels of said main bit line and said sub bit line during a resetting operation after an erasing operation of said nonvolatile semiconductor memory device, and
- a well potential control circuit controlled by said control circuit for controlling and resetting potentials for said plurality of first well regions and said second well region, and
- said control circuit maintains a conductive state of said select transistors which couple said main bit lines to said sub bit lines to be reset during said resetting operation.

8. The nonvolatile semiconductor memory device according to claim 1, wherein said well potential control circuit includes:
- a comparator comparing the potential level of said first well region with that of said second region, and
- a voltage applying circuit, based on the comparison result of said comparator, capable of applying said boosted potential to said first and second well regions independently during said erasing operation so as to prevent the forward bias to said PN junction.

* * * * *